(12) United States Patent
Ohashi et al.

(10) Patent No.: US 9,464,167 B2
(45) Date of Patent: Oct. 11, 2016

(54) POLY α-AMINO ACID AND FERROELECTRIC MEMORY ELEMENT USING SAME

(71) Applicant: AJINOMOTO CO., INC., Chuo-ku (JP)

(72) Inventors: Satoru Ohashi, Kawasaki (JP); Sei Uemura, Tsukuba (JP); Manabu Kitazawa, Kawasaki (JP); Toshihide Kamata, Tsukuba (JP)

(73) Assignee: AJINOMOTO CO., INC., Chuo-ku (JP)

( * ) Notice: Subject to any disclaimer, the term of this patent is extended or adjusted under 35 U.S.C. 154(b) by 375 days.

(21) Appl. No.: 14/076,363

(22) Filed: Nov. 11, 2013

(65) Prior Publication Data

US 2014/0138654 A1 May 22, 2014

Related U.S. Application Data

(63) Continuation-in-part of application No. PCT/JP2012/062232, filed on May 11, 2012.

(30) Foreign Application Priority Data

May 12, 2011 (JP) ................................. 2011-107643

(51) Int. Cl.
*G11C 11/22* (2006.01)
*H01L 41/08* (2006.01)
*H01L 41/193* (2006.01)
(Continued)

(52) U.S. Cl.
CPC ............ *C08G 63/685* (2013.01); *B82Y 10/00* (2013.01); *G11C 11/221* (2013.01); *H01L 51/0002* (2013.01); *H01L 51/0512* (2013.01); *H01L 51/0591* (2013.01); *G11C 11/22* (2013.01);
(Continued)

(58) Field of Classification Search
CPC ..... G11C 11/221; G11C 11/22; H01H 13/14; H01H 2209/024; H01H 2221/002; H01H 2209/074; C08G 63/685; H01L 51/0512; H01L 51/002; H01L 51/0591; H01L 51/0003
See application file for complete search history.

(56) References Cited

U.S. PATENT DOCUMENTS

2014/0368083 A1* 12/2014 Ohashi .................... C08L 77/04
310/311
2015/0311012 A1* 10/2015 Wada ................. H03K 17/9643
200/514

FOREIGN PATENT DOCUMENTS

JP 63-128317 5/1988
JP 3-156430 7/1991
(Continued)

OTHER PUBLICATIONS

International Search Report issued Aug. 14, 2012, in International Application No. PCT/JP2012/062232.
(Continued)

*Primary Examiner* — Hien Nguyen
(74) *Attorney, Agent, or Firm* — Oblon, McClelland, Maier & Neustadt, L.L.P

(57) ABSTRACT

Ferroelectric memory elements which contain a poly α-amino acid which is a copolymer containing a glutamic acid-γ-ester unit represented by the formula (I), defined herein, and a glutamic acid-γ-ester unit represented by the formula (II), defined herein, in a molar ratio of units of formula (I) to units of formula (II) of 10/90-90/10 are useful as recording elements such as RFID and the like.

32 Claims, 4 Drawing Sheets

(51) Int. Cl.
- *C08G 69/10* (2006.01)
- *C08G 63/685* (2006.01)
- *H01L 51/05* (2006.01)
- *H01L 51/00* (2006.01)
- *B82Y 10/00* (2011.01)
- *H01L 29/78* (2006.01)

(52) U.S. Cl.
CPC ...... *H01L 29/78391* (2014.09); *H01L 51/0003* (2013.01); *H01L 51/052* (2013.01)

(56) References Cited

FOREIGN PATENT DOCUMENTS

| | | |
|---|---|---|
| JP | 4-102827 | 4/1992 |
| JP | 8-24625 | 1/1996 |
| JP | 11-217432 | 8/1999 |
| JP | 2005-311336 | 11/2005 |
| JP | 2007-73557 | 3/2007 |

OTHER PUBLICATIONS

Extended European Search Report issued Feb. 25, 2015 in Patent Application No. 12782324.3.

Masatoshi Hasegawa, et al., "Memory mechanism of printable ferroelectric TFT memory with tertiary structured polypeptide as a dielectric layer" Synthetic Metals, XP026120848, vol. 159, No. 9-10, 2009, pp. 961-964.

* cited by examiner

POLY α-AMINO ACID AND FERROELECTRIC MEMORY ELEMENT USING SAME

TECHNICAL FIELD

The present invention relates to a specific poly α-amino acid, a ferroelectric memory element having the poly α-amino acid as a ferroelectric substance, a tag having a ferroelectric memory element having the poly α-amino acid as a ferroelectric substance, ink containing the poly α-amino acid and the like.

BACKGROUND ART

As an information recording element that expresses non-volatile memory property, ferroelectric memory elements using a ferroelectric layer are known. Recently, use of an organic material for the ferroelectric layer thereof has been considered. This is because a thin film of a ferroelectric substance can be formed by applying or printing a solution of an organic material to utilize the solvent solubility thereof, and the film can be utilized as a ferroelectric layer. In view of such characteristics, application of the film to mass-pervasive type information recording apparatuses is expected. For example, it is application to recording elements such as tag, specifically RFID (Radio Frequency Identification) tag, ID tag, IC tag, RF (Radio Frequency) tag, wireless tag, electron tag and the like, and the like.

It is well known that fluorine group polymers such as polyvinylidene fluoride (PVDF), vinylidene fluoride-trifluoroethylene copolymer (P(VDF/TrFE)) and the like show ferroelectricity. However, since fluorine group polymers do not show good film forming property, which causes problems in terms of the uniformity of film thickness, smoothness of film surface and the like.

On the other hand, patent document 1 describes that poly α-amino acid with helix geometry shows ferroelectricity and patent document 2 proposes a ferroelectric memory element having a ferroelectric layer formed from poly α-amino acid. In addition, patent document 3 proposes a ferroelectric memory element having a ferroelectric layer formed from a mixture of poly α-amino acid and a different polymer (specifically, polymethylmethacrylate (PMMA) etc.).

However, a ferroelectric memory element utilizing the poly α-amino acid specifically described in patent documents 2 and 3 has a problem of decrease in the memory property at high temperature, and cannot be dissolved in a particular solvent. Therefore, the element cannot be used as a material that can be printed on and is requested to be dissolved in various solvents. Since a technical approach for resolving such problem has not been taken, practicalization has not been made as yet.

On the other hand, patent document 4 describes a method including applying an electric field to poly α-amino acid at a temperature not less than the liquid crystal transition, and using same for an optical memory. However, patent document 4 only discloses that an optical memory capable of changing the reading wavelength can be provided by applying an electric field, and does not at all mention that it can be used for a ferroelectric memory element which is based on a completely different principle, or the memory property of a ferroelectric memory element at high temperature.

DOCUMENT LIST

Patent Documents patent document 1: JP-A-11-21743
patent document 2: JP-A-2005-311336
patent document 3: JP-A-2007-73557
patent document 4: JP-A-63-128317

SUMMARY OF THE INVENTION

Problems to be Solved by the Invention

The problem of the present invention is to provide poly α-amino acid that can be dissolved in various solvents, has good film forming property, and can stably express memory property, a ferroelectric memory element that shows superior formability and superior operational stability even when exposed to a high temperature, a tag using the ferroelectric memory element and ink containing poly α-amino acid.

Means of Solving the Problems

The present inventors have conducted intensive studies in an attempt to solve the above-mentioned problem, and found that a specific poly α-amino acid can be dissolved in various solvents and can easily form a thin film having a uniform film thickness, and a ferroelectric memory element using the thin film as a ferroelectric layer has extremely high heat resistance. In patent documents 2, 3, only several kinds of α-amino acid homopolymers are used as a thin film for actually producing a ferroelectric memory element, and the memory property of a thin film made from the particular poly α-amino acid of the present invention is not described or suggested.

Accordingly, the present invention provides the following.

[1] A ferroelectric memory element having a ferroelectric layer, wherein the ferroelectric layer comprises a poly α-amino acid which is a copolymer comprising a glutamic acid-γ-ester unit represented by the formula (I):

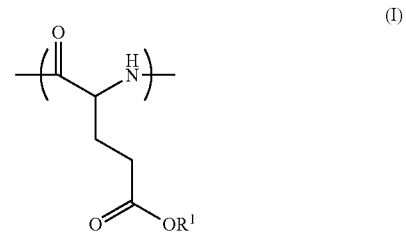

wherein $R^1$ is a substituted or unsubstituted alkyl group having 1-8 carbon atoms, or a benzyl group optionally substituted by a halogen atom, an alkoxy group or a nitro group, and a glutamic acid-γ-ester unit represented by the formula (II):

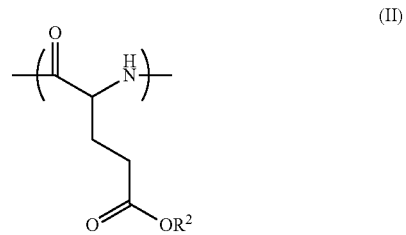

wherein $R^2$ is an unsubstituted alkyl group having 3-16 carbon atoms, or an alkyl group having 1-6 carbon wherein a part or all of hydrogen atom is substituted by a halogen atom, an alicyclic hydrocarbon group having 3-12 carbon atoms, an alkoxy group having 1-6 carbon atoms, a cyano group, a phenyl group (a part or all of hydrogen atom is optionally substituted by a halogen atom or an alkoxy group), a phenylalkoxy group (a part or all of hydrogen atom is optionally substituted by a halogen atom or an alkoxy group), or a phenylalkylcarbamate group (a part or all of hydrogen atom is optionally substituted by a halogen atom or an alkoxy group), provided that it is not the same as $R^1$, or an alanine, phenylalanine or N-substituted lysine unit represented by the formula (III):

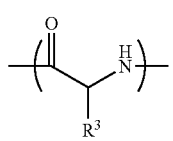

(III)

wherein $R^3$ is a methyl group, a benzyl group or —$(CH_2)_4$—NHX group (wherein X is a benzyloxycarbonyl group optionally substituted by a halogen atom or an alkoxy group, an alkylcarbonyl group optionally substituted by a halogen atom, an allyloxycarbonyl group, a fluorenylalkoxycarbonyl group, a benzenesulfonyl group optionally substituted by an alkyl group or a nitro group, or an alkyloxycarbonyl group, wherein the content ratio of the unit of the formula (I), and the unit of the formula (II) or the unit of the formula (III) ((I)/(II) or (I)/(III)) is 10/90-90/10 in a molar ratio.

[2] The ferroelectric memory element of the above-mentioned [1], wherein, in the formula (I), $R^1$ is a methyl group or a benzyl group, in the formula (II), $R^2$ is an unsubstituted alkyl group having 6-16 carbon atoms or an alkyl group having 1-6 carbon atoms wherein a part or all of hydrogen atom is substituted by a halogen atom or an alicyclic hydrocarbon group having 3-12 carbon atoms and, in the formula (III), $R^3$ is a methyl group, a benzyl group or a —$(CH_2)_4$—NHX group (wherein X is a benzyloxycarbonyl group).

[3] The ferroelectric memory element of the above-mentioned [1] or [2], wherein the poly α-amino acid is a copolymer comprising the unit of the formula (I) and the unit of the formula (II).

[4] The ferroelectric memory element of the above-mentioned [3], wherein the poly α-amino acid is obtained by polymerizing an N-carboxy-α-glutamic acid-γ-ester anhydride comprising an ester group represented by the formula: —$COOR^1$ wherein $R^1$ is as defined above introduced therein and an N-carboxy-α-glutamic acid-γ-ester anhydride comprising an ester group represented by the formula: —$COOR^2$ wherein $R^2$ is as defined above introduced therein.

[5] A ferroelectric memory element having a ferroelectric layer, wherein the ferroelectric layer comprises a poly α-amino acid which is a homopolymer composed of a glutamic acid-γ-ester unit represented by the formula (IV):

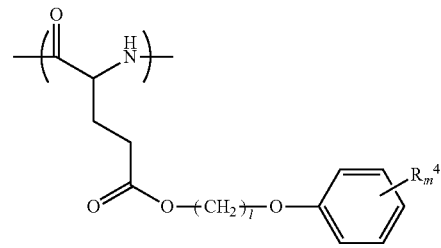

(IV)

wherein $R^4$ is an alkoxy group having 1-12 carbon atoms, an alkyl group having 1-12 carbon atoms wherein a part or all of hydrogen atom is substituted by a halogen atom, or an alkylcarbonyl group wherein the alkyl group has 1-12 carbon atoms, $R^4$ in the number of m may be the same or different, l is an integer of 6-12, and m is an integer of 1-3, or a copolymer of a glutamic acid-γ-ester unit represented by the formula (IV) and a glutamic acid-γ-ester unit represented by the formula (I):

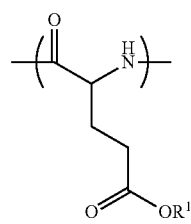

(I)

wherein $R^1$ is a substituted or unsubstituted alkyl group having 1-8 carbon atoms, or a benzyl group optionally substituted by a halogen atom, an alkoxy group or a nitro group, wherein the content of the glutamic acid-γ-ester unit represented by the formula (IV) is not less than 40 mol %.

[6] The ferroelectric memory element of the above-mentioned [5], wherein the poly α-amino acid is a copolymer comprising the unit of the formula (I) and the unit of the formula (IV), $R^1$ in the formula (I) is a methyl group or a benzyl group, and the content of the glutamic acid-γ-ester unit represented by the formula (IV) in the copolymer is not less than 80 mol %.

[7] The ferroelectric memory element of the above-mentioned [5] or [6], wherein the poly α-amino acid is obtained by polymerizing an N-carboxy-α-glutamic acid-γ-ester anhydride comprising an ester group represented by the formula: —$COOR^5$ wherein $R^5$ is

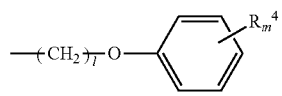

wherein $R^4$, l and m are as defined above, introduced therein, or polymerizing the N-carboxy-α-glutamic acid-γ-ester anhydride and an N-carboxy-α-glutamic acid-γ-ester anhydride comprising an ester group represented by the formula: —$COOR^1$ wherein $R^1$ is as defined above introduced therein.

[8] The ferroelectric memory element of any one of the above-mentioned [1]-[7], wherein the poly α-amino acid has a number average molecular weight of 2,000-50,000.

[9] The ferroelectric memory element of any one of the above-mentioned [1]-[8], which shows memory property at 100° C.
[10] The ferroelectric memory element of any one of the above-mentioned [1]-[9], which is of a transistor type.
[11] The ferroelectric memory element of any one of the above-mentioned [1]-[10], comprising a ferroelectric layer, a gate electrode, a semiconductor layer, a source electrode and a drain electrode on a substrate.
[12] The ferroelectric memory element of the above-mentioned [11], wherein a source electrode and a drain electrode are configured on the semiconductor layer.
[13] A tag having the ferroelectric memory element of any one of the above-mentioned [1]-[12].
[14] A method of producing a ferroelectric memory element, comprising
a step of dissolving one or more kinds of poly α-amino acids selected from the group consisting of
(A-1) a poly α-amino acid which is a copolymer comprising a glutamic acid-γ-ester unit represented by the formula (I):

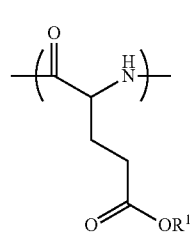

(I)

wherein R¹ is a substituted or unsubstituted alkyl group having 1-8 carbon atoms, or a benzyl group optionally substituted by a halogen atom, an alkoxy group or a nitro group, and
a glutamic acid-γ-ester unit represented by the formula (II):

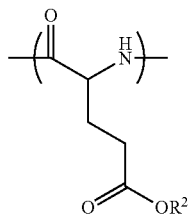

(II)

wherein R² is an unsubstituted alkyl group having 3-16 carbon atoms, or an alkyl group having 1-6 carbon wherein a part or all of hydrogen atom is substituted by a halogen atom, an alicyclic hydrocarbon group having 3-12 carbon atoms, an alkoxy group having 1-6 carbon atoms, a cyano group, a phenyl group (a part or all of hydrogen atom is optionally substituted by a halogen atom or an alkoxy group), a phenylalkoxy group (a part or all of hydrogen atom is optionally substituted by a halogen atom or an alkoxy group), or a phenylalkylcarbamate group (a part or all of hydrogen atom is optionally substituted by a halogen atom or an alkoxy group), provided that it is not the same as R¹, or
an alanine, phenylalanine or N-substituted lysine unit represented by the formula (III):

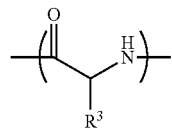

(III)

wherein R³ is a methyl group, a benzyl group or —(CH₂)₄—NHX group (wherein X is a benzyloxycarbonyl group optionally substituted by a halogen atom or an alkoxy group, an alkylcarbonyl group optionally substituted by a halogen atom, an allyloxycarbonyl group, a fluorenylalkoxycarbonyl group, a benzenesulfonyl group optionally substituted by an alkyl group or a nitro group, or an alkyloxycarbonyl group, wherein
the content ratio of the unit of the formula (I), and the unit of the formula (II) or the unit of the formula (III) ((I)/(II) or (I)/(III)) is 10/90-90/10 in a molar ratio, and
(A-2) a poly α-amino acid which is a homopolymer composed of a glutamic acid-γ-ester unit represented by the formula (IV):

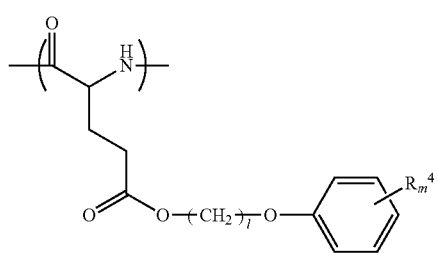

(IV)

wherein R⁴ is an alkoxy group having 1-12 carbon atoms, an alkyl group having 1-12 carbon atoms wherein a part or all of hydrogen atom is substituted by a halogen atom, or an alkylcarbonyl group wherein the alkyl group has 1-12 carbon atoms, R⁴ in the number of m may be the same or different, l is an integer of 6-12, and m is an integer of 1-3, or a copolymer of a glutamic acid-γ-ester unit represented by the formula (IV) and a glutamic acid-γ-ester unit represented by the formula (I):

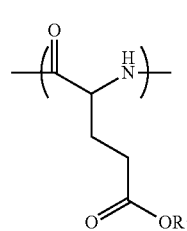

(I)

wherein R¹ is a substituted or unsubstituted alkyl group having 1-8 carbon atoms, or a benzyl group optionally substituted by a halogen atom, an alkoxy group or a nitro group, wherein the content of the glutamic acid-γ-ester unit represented by the formula (IV) is not less than 40 mol %, in an organic solvent to give a poly α-amino acid-containing ink:
a step of applying the poly α-amino acid-containing ink onto a substrate; and a step of drying the applied poly α-amino acid-containing ink.

[15] The method of the above-mentioned [14], wherein the organic solvent is one or more kinds selected from the group consisting of chlorohydrocarbon solvents, fluorine-containing branched alcohol solvents, nitrogen-containing polar solvents, hydrocarbon ketone solvents, benzoic acid ester solvents, aromatic hydrocarbon solvents, glycol ether solvents, and glycol ester solvents.

[16] The method of the above-mentioned [14], wherein the organic solvent is one or more kinds selected from the group consisting of dichloromethane, chloroform, 1,1,1,3,3,3-hexafluoroisopropanol, methylene chloride, dichloroethane, N-methylpyrrolidone, N,N-dimethylacetamide, methyl ethyl ketone, cyclohexanone, methyl benzoate, toluene, triethylene glycol dimethylether, acetone, and butyl carbitol acetate.

[17] The method of any one of the above-mentioned [14]-[16], wherein the step of applying a poly α-amino acid-containing ink onto the substrate is a step of printing the poly α-amino acid-containing ink on the substrate.

[18] A poly α-amino acid which is a copolymer comprising a glutamic acid-γ-ester unit represented by the formula (I):

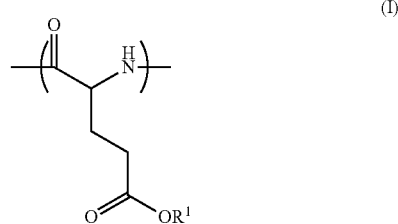

(I)

wherein $R^1$ is a substituted or unsubstituted alkyl group having 1-8 carbon atoms, or a benzyl group optionally substituted by a halogen atom, an alkoxy group or a nitro group, and a glutamic acid-γ-ester unit represented by the formula (II):

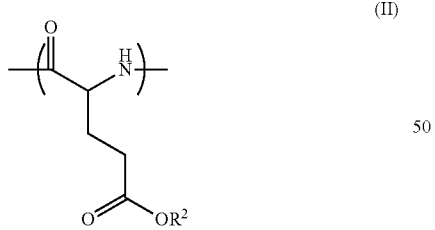

(II)

wherein $R^2$ is an alkyl group having 1-6 carbon wherein a part or all of hydrogen atom is substituted by a halogen atom, an alicyclic hydrocarbon group having 3-12 carbon atoms, an alkoxy group having 1-6 carbon atoms, a cyano group, a phenyl group (a part or all of hydrogen atom is optionally substituted by a halogen atom or an alkoxy group), a phenylalkoxy group (a part or all of hydrogen atom is optionally substituted by a halogen atom or an alkoxy group), or a phenylalkylcarbamate group (a part or all of hydrogen atom is optionally substituted by a halogen atom or an alkoxy group), provided that it is not the same as $R^1$, or an alanine, phenylalanine or N-substituted lysine unit represented by the formula (III):

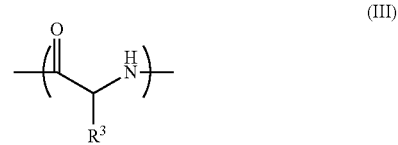

(III)

wherein $R^3$ is a methyl group, a benzyl group or —$(CH_2)_4$—NHX group (wherein X is a benzyloxycarbonyl group optionally substituted by a halogen atom or an alkoxy group, an alkylcarbonyl group optionally substituted by a halogen atom, an allyloxycarbonyl group, a fluorenylalkoxycarbonyl group, a benzenesulfonyl group optionally substituted by an alkyl group or a nitro group, or an alkyloxycarbonyl group, wherein the content ratio of the unit of the formula (I), and the unit of the formula (II) or the unit of the formula (III) ((I)/(II) or (I)/(III)) is 10/90-90/10 in a molar ratio. [19] The poly α-amino acid of the above-mentioned [18], wherein, in the formula (I), $R^1$ is a methyl group or a benzyl group, in the formula (II), $R^2$ is an alkyl group having 1-6 carbon atoms wherein a part or all of hydrogen atom is substituted by a halogen atom or an alicyclic hydrocarbon group having 3-12 carbon atoms and, in the formula (III), $R^3$ is a methyl group, a benzyl group or a —$(CH_2)_4$—NHX group (wherein X is a benzyloxycarbonyl group).

[20] A poly α-amino acid which is a copolymer composed of a glutamic acid-γ-ester unit represented by the formula (IV):

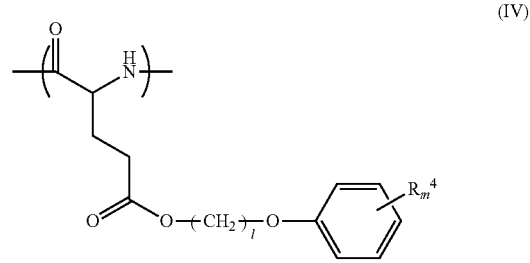

(IV)

wherein $R^4$ is an alkyl group having 1-12 carbon atoms wherein a part or all of hydrogen atom is substituted by a halogen atom, $R^4$ in the number of m may be the same or different, l is an integer of 6-12, and m is an integer of 1-3, and a glutamic acid-γ-ester unit represented by the formula (I):

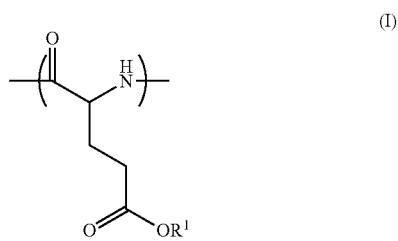

(I)

wherein $R^1$ is a substituted or unsubstituted alkyl group having 1-8 carbon atoms, or a benzyl group optionally substituted by a halogen atom, an alkoxy group or a nitro group, wherein the content of the glutamic acid-γ-ester unit represented by the formula (IV) is not less than 40 mol %.

[21] The poly α-amino acid of the above-mentioned [20], which is a copolymer comprising the unit of the formula (I) and the unit of the formula (IV), in the formula (I), $R^1$ is a methyl group or a benzyl group, and the content of the glutamic acid-γ-ester unit represented by the formula (IV) in the copolymer is not less than 80 mol %.

[22] The poly α-amino acid of any one of the above-mentioned [18]-[20], which shows memory property at 100° C.

[23] A poly α-amino acid-containing ink comprising one or more kinds of poly α-amino acids selected from the group consisting of (A-1) a poly α-amino acid which is a copolymer comprising a glutamic acid-γ-ester unit represented by the formula (I):

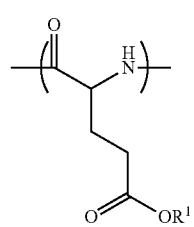

(I)

wherein $R^1$ is a substituted or unsubstituted alkyl group having 1-8 carbon atoms, or a benzyl group optionally substituted by a halogen atom, an alkoxy group or a nitro group, and a glutamic acid-γ-ester unit represented by the formula (II):

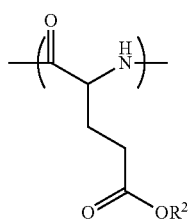

(II)

wherein $R^2$ is an unsubstituted alkyl group having 3-16 carbon atoms, or an alkyl group having 1-6 carbon wherein a part or all of hydrogen atom is substituted by a halogen atom, an alicyclic hydrocarbon group having 3-12 carbon atoms, an alkoxy group having 1-6 carbon atoms, a cyano group, a phenyl group (a part or all of hydrogen atom is optionally substituted by a halogen atom or an alkoxy group), a phenylalkoxy group (a part or all of hydrogen atom is optionally substituted by a halogen atom or an alkoxy group), or a phenylalkylcarbamate group (a part or all of hydrogen atom is optionally substituted by a halogen atom or an alkoxy group), provided that it is not the same as $R^1$, or an alanine, phenylalanine or N-substituted lysine unit represented by the formula (III):

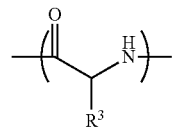

(III)

wherein $R^3$ is a methyl group, a benzyl group or —$(CH_2)_4$—NHX group (wherein X is a benzyloxycarbonyl group optionally substituted by a halogen atom or an alkoxy group, an alkylcarbonyl group optionally substituted by a halogen atom, an allyloxycarbonyl group, a fluorenylalkoxycarbonyl group, a benzenesulfonyl group optionally substituted by an alkyl group or a nitro group, or an alkyloxycarbonyl group, wherein the content ratio of the unit of the formula (I), and the unit of the formula (II) or the unit of the formula (III) ((I)/(II) or (I)/(III)) is 10/90-90/10 in a molar ratio, and (A-2) a poly α-amino acid which is a homopolymer composed of a glutamic acid-γ-ester unit represented by the formula (IV):

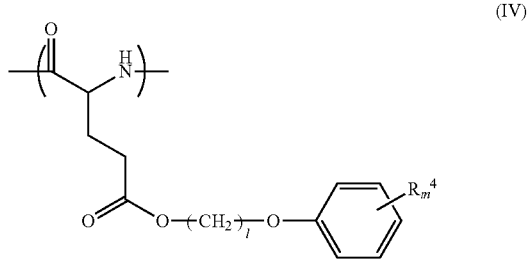

(IV)

wherein $R^4$ is an alkoxy group having 1-12 carbon atoms, an alkyl group having 1-12 carbon atoms wherein a part or all of hydrogen atom is substituted by a halogen atom, or an alkylcarbonyl group wherein the alkyl group has 1-12 carbon atoms, $R^4$ in the number of m may be the same or different, l is an integer of 6-12, and m is an integer of 1-3, or a copolymer of a glutamic acid-γ-ester unit represented by the formula (IV) and a glutamic acid-γ-ester unit represented by the formula (I):

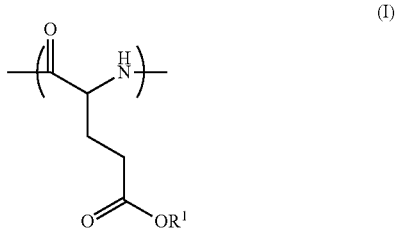

(I)

wherein $R^1$ is a substituted or unsubstituted alkyl group having 1-8 carbon atoms, or a benzyl group optionally substituted by a halogen atom, an alkoxy group or a nitro group, wherein the content of the glutamic acid-γ-ester unit represented by the formula (IV) is not less than 40 mol %; and (B) an organic solvent.

[24] The poly α-amino acid-containing ink of the above-mentioned [23], wherein the organic solvent is one or more kinds selected from the group consisting of chlorohydrocarbon solvents, fluorine-containing branched alcohol solvents, nitrogen-containing polar solvents, hydrocarbon ketone solvents, benzoic acid ester solvents, aromatic hydrocarbon solvents, glycol ether solvents, and glycol ester solvents.

[25] The poly α-amino acid-containing ink of the above-mentioned [23], wherein the organic solvent is one or more kinds selected from the group consisting of dichloromethane, chloroform, 1,1,1,3,3,3-hexafluoroisopropanol, methylene chloride, dichloroethane, N-methylpyrrolidone, N,N-dimethylacetamide, methyl ethyl ketone, cyclohexanone, methyl benzoate, toluene, triethylene glycol dimethylether, acetone, and butyl carbitol acetate.

[26] The poly α-amino acid-containing ink of any one of [23]-[25], wherein the poly α-amino acid is a copolymer comprising the unit of the formula (I) and the unit of the formula (II).

[27] The poly α-amino acid-containing ink of the above-mentioned [26], wherein the poly α-amino acid is obtained by polymerizing the N-carboxy-α-glutamic acid-γ-ester anhydride comprising an ester group represented by the formula: —COOR$^1$ wherein R$^1$ is as defined above introduced therein, and an N-carboxy-α-glutamic acid-γ-ester anhydride comprising an ester group represented by the formula: —COOR$^2$ wherein R$^2$ is as defined above introduced therein.

[28] The poly α-amino acid-containing ink of any one of [23]-[25], wherein the poly α-amino acid is a homopolymer composed of the unit of the formula (IV) or a copolymer comprising the unit of the formula (IV) and the unit of the formula (I).

[29] The poly α-amino acid-containing ink of the above-mentioned [28], wherein the poly α-amino acid is obtained by polymerizing an N-carboxy-α-glutamic acid-γ-ester anhydride comprising an ester group represented by the formula: —COOR$^5$ wherein R$^5$ is

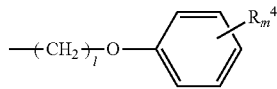

wherein R$^4$, l and m are as defined above, introduced therein, or polymerizing the N-carboxy-α-glutamic acid-γ-ester anhydride and an N-carboxy-α-glutamic acid-γ-ester anhydride comprising an ester group represented by the formula: —COOR$^1$ wherein R$^1$ is as defined above introduced therein.

[30] The poly α-amino acid-containing ink of any one of [23]-[29], wherein the poly α-amino acid has a number average molecular weight of 2,000-50,000.

[31] The poly α-amino acid-containing ink of any one of [23]-[30], wherein a concentration of the poly α-amino acid in the ink is 1-20 wt %.

[32] The poly α-amino acid-containing ink of any one of [23]-[31], which is free of p-toluenesulfonic acid or the concentration of the p-toluenesulfonic acid in the ink is not more than 0.5 mol %.

Effect of the Invention

The present invention can provide a ferroelectric memory element that shows superior formability and superior operational stability even when exposed to a high temperature.

DESCRIPTION OF EMBODIMENTS

Figure 1:
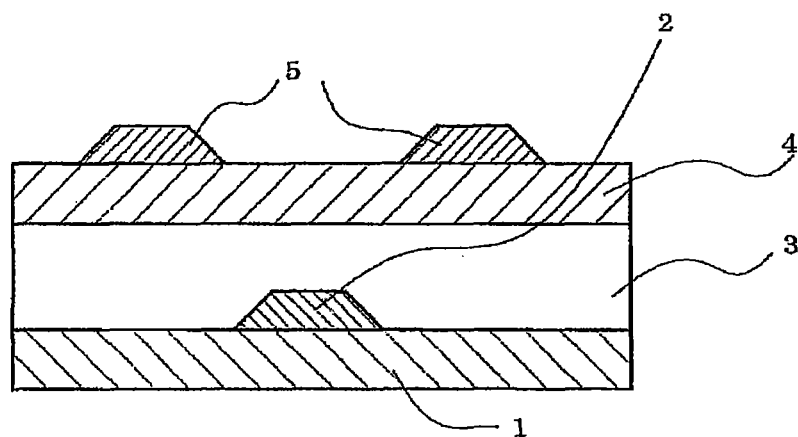
FIG. 1 is a schematic sectional view of a field effect transistor ferroelectric memory element, which is one embodiment of the ferroelectric memory elements produced in the present invention.

The present invention is explained in more detail in the following.

In the present specification, the ferroelectric memory is also referred to as Ferroelectric Memory, which is a memory that utilizes ferroelectricity wherein the direction of spontaneous polarization in a substance is changed by applying a voltage, and the direction of polarization can be sustained even without applying a voltage. A ferroelectric memory element is an element used for the ferroelectric memory (electronic component constituting ferroelectric memory), and has at least a substrate, an electrode and a ferroelectric layer.

In the present invention, the memory property means that an electric current-voltage property (a transfer characteristic) when a voltage is applied to a ferroelectric memory element shows specific hysteresis.

The transfer characteristic refers to the electric current-voltage property showing the relationship between an electric current Ids that flows between a drain electrode and a source electrode, and a gate voltage Vg.

The ON/OFF ratio refers to a ratio of ON value and OFF value wherein the ON value is the maximum value of the electric current Ids that flows between the source and the drain in the measurement of the transfer characteristic and the OFF value is the minimum value thereof.

The operational stability at a high temperature means that memory property is shown even at a high temperature and, in another aspect, it means that the memory property at room temperature is maintained even when exposed to a high temperature.

[poly α-amino acid]

The poly α-amino acid (A-1) in the first embodiment, which is used for the present invention is a copolymer comprising a glutamic acid-γ-ester unit represented by the formula (I):

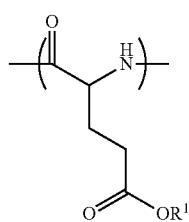

(I)

wherein R¹ is a substituted or unsubstituted alkyl group having 1-8 carbon atoms, or a benzyl group optionally substituted by a halogen atom, an alkoxy group or a nitro group, and a glutamic acid-γ-ester unit represented by the formula (II):

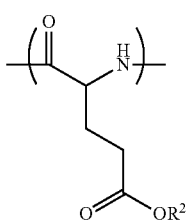

(II)

wherein R² is an unsubstituted alkyl group having 3-16 carbon atoms, or an alkyl group having 1-6 carbon wherein a part or all of hydrogen atom is substituted by a halogen atom, an alicyclic hydrocarbon group having 3-12 carbon atoms, an alkoxy group having 1-6 carbon atoms, a cyano group, a phenyl group (a part or all of hydrogen atom is optionally substituted by a halogen atom or an alkoxy group), a phenylalkoxy group (a part or all of hydrogen atom is optionally substituted by a halogen atom or an alkoxy group), or a phenylalkylcarbamate group (a part or all of hydrogen atom is optionally substituted by a halogen atom or an alkoxy group), provided that it is not the same as R¹, or an alanine, phenylalanine or N-substituted lysine unit represented by the formula (III):

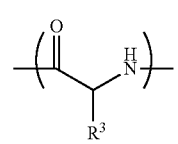

(III)

wherein R³ is a methyl group, a benzyl group or —(CH₂)₄—NHX group (wherein X is a benzyloxycarbonyl group optionally substituted by a halogen atom or an alkoxy group, an alkylcarbonyl group optionally substituted by a halogen atom, an allyloxycarbonyl group, a fluorenylalkoxycarbonyl group, a benzenesulfonyl group optionally substituted by an alkyl group or a nitro group, or an alkyloxycarbonyl group.

In the copolymer, while the units of the formula (I)—the formula (III) may each contain two or more kinds of units having different substituents, a single unit having the same substituent is preferable. The glutamic acid-γ-ester constituting the unit of the formula (I) and the unit of the formula (II), and alanine, phenylalanine, N-substituted lysine constituting the unit of the formula (III) each may be an L form or a D form, with preference given to an L form.

In the formula (I), R¹ is a substituted or unsubstituted alkyl group having 1-8 carbon atoms, or a benzyl group optionally substituted by a halogen atom, an alkoxy group or a nitro group. Preferably, in the formula (I), R¹ is a methyl group or a benzyl group.

The "alkyl group having 1-8 carbon atoms" is a linear or branched alkyl group. Examples thereof include methyl group, ethyl group, n-propyl group, n-butyl group, n-pentyl group, n-hexyl group, n-heptyl group, n-octyl group, isopropyl group, sec-butyl group, tert-butyl group, 2-methylbutyl group, 3-ethylbutyl group, 4-ethylbutyl group, 2-methylpentyl group, 3-methylpentyl group, 4-methylpentyl group, 5-methylpentyl group, 2-methylhexyl group, 3-methylhexyl group, 4-methylhexyl group, 5-methylhexyl group, 6-methylhexyl group, 3-ethylhexyl group, 4-ethylhexyl group, 5-ethylhexyl group, 6-ethylhexyl group, 2-methylheptyl group, 3-ethylheptyl group, 4-propylheptyl group, 2,3-dimethylbutyl group, 2,4-dimethylbutyl group, 4,4-dipropylbutyl group, 2-methyl-3-ethylpentyl group, 2,3,4-trimethylpentyl group and the like. Among these, an alkyl group having 1-6 carbon atoms is preferable, an alkyl group having 1-3 carbon atoms is more preferable, a methyl group, an ethyl group, an n-propyl group or an isopropyl group is more preferable, a methyl group or ethyl group having 1 or 2 carbon atoms is more preferable, and a methyl group is more preferable. A part or all of hydrogen atom of the above-mentioned alkyl group may be substituted and, for example, an alkyl group substituted by a halogen atom, an alkoxy group etc. can be mentioned. Examples of the "halogen atom" include fluorine atom, chlorine atom, bromine atom, iodine atom and the like. Among these, a fluorine atom or a chlorine atom is preferable, and a fluorine atom is more preferable.

Examples of the "halogen atom" in the "benzyl group optionally substituted by a halogen atom, an alkoxy group or a nitro group" include a fluorine atom, a chlorine atom, bromine atom, an iodine atom and the like. Among these, a fluorine atom, a bromine atom or a chlorine atom is preferable. The alkoxy group is a linear, branched or cyclic alkoxy group, preferably an alkoxy group having 1-6 carbon atoms. Examples thereof include methoxy group, ethoxy group, n-propoxy group, n-butoxy group, n-pentyloxy group, n-hexyloxy group, methylenedioxy group and the like, preferred is a methoxy group, an ethoxy group, an n-propoxy group or a methylenedioxy group, and more preferred is a methoxy group.

Examples of the "benzyl group optionally substituted by a halogen atom, an alkoxy group or a nitro group" include p-bromobenzyl group, p-chlorobenzyl group, p-fluorobenzyl group, p-methoxybenzyl group, 2,6-dimethoxybenzyl group, 3,4-methylenedioxybenzyl group, o-nitrobenzyl group, p-nitrobenzyl group, 2-nitro-4,5-dimethoxybenzyl group, and a benzyl group. Among these, a p-methoxybenzyl group, a p-nitrobenzyl group, and a benzyl group are preferable, and a benzyl group is more preferable.

While it is not particularly limited whether the substituent R¹ in the unit of the formula (I) is a substituted or unsubstituted alkyl group having 1-8 carbon atoms or a benzyl group optionally substituted by a halogen atom, an alkoxy group or a nitro group, it is preferably a substituted or unsubstituted alkyl group having 1-8 carbon atoms, more preferably an unsubstituted alkyl group having 1-8 carbon atoms, more preferably an unsubstituted alkyl group having 1-6 carbon atoms, and more preferably a methyl group, since a ferroelectric memory element with a high ON/OFF ratio can be obtained.

In the unit of the formula (II), the unsubstituted alkyl group having 3-16 carbon atoms at substituent $R^2$ is a linear or branched alkyl group. Examples thereof include n-propyl group, n-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, 3-ethylbutyl group, 4-ethylbutyl group, 2-methylpentyl group, 3-methylpentyl group, 4-methylpentyl group, 5-methylpentyl group, 2-methylhexyl group, 3-methylhexyl group, 4-methylhexyl group, 5-methylhexyl group, 6-methylhexyl group, 3-ethylhexyl group, 4-ethylhexyl group, 5-ethylhexyl group, 6-ethylhexyl group, 4-propylhexyl group, 5-propylhexyl group, 6-propylhexyl group, 5-butylhexyl group, 6-butylhexyl group, 6-pentylhexyl group, 2-methylheptyl group, 3-ethylheptyl group, 4-propylheptyl group, 5-butylheptyl group, 6-pentylheptyl group, 7-hexylheptyl group, 2-methyloctyl group, 3-ethyloctyl group, 4-propyloctyl group, 5-butyloctyl group, 6-pentyloctyl group, 7-hexyloctyl group, 8-heptyloctyl group, 2-methylnonyl group, 3-ethylnonyl group, 4-propylnonyl group, 5-butylnonyl group, 6-pentylnonyl group, 7-hexylnonyl group, 8-heptylnonyl group, 2-methyldecyl group, 2-methylundecyl group, 2-methyldodecyl group, 2-methyltridecyl group, 2-methyltetradecyl group, 2-methylpentadecyl group, 3,3-diethylpropyl group, 2,3-dimethylbutyl group, 2,4-dimethylbutyl group, 4,4-dipropylbutyl group, 2-methyl-3-ethylpentyl group, 2,3,4-trimethylpentyl group, 2-methyl-3-propylhexyl group and the like. Among these, a linear alkyl group is preferable, a linear alkyl group having 3-12 carbon atoms (i.e., n-propyl group, n-butyl group, n-pentyl group, n-hexyl group, n-heptyl group, n-octyl group, n-nonyl group, n-decyl group, n-undecyl group, n-dodecyl group etc.) is more preferable, and an n-hexyl group, an n-octyl group or an n-dodecyl group is further preferable.

The "alkyl group having 1-6 carbon atoms" of the alkyl group having 1-6 carbon wherein a part or all of hydrogen atom is substituted by a halogen atom, an alicyclic hydrocarbon group having 3-12 carbon atoms, an alkoxy group having 1-6 carbon atoms, a cyano group, a phenyl group (a part or all of hydrogen atom is optionally substituted by a halogen atom or an alkoxy group), a phenylalkoxy group (a part or all of hydrogen atom is optionally substituted by a halogen atom or an alkoxy group), or a phenylalkylcarbamate group (a part or all of hydrogen atom is optionally substituted by a halogen atom or an alkoxy group), for substituent $R^2$, is a linear or branched alkyl group. Examples thereof include methyl group, ethyl group, n-propyl group, n-butyl group, n-pentyl group, n-hexyl group, isopropyl group, sec-butyl group, tert-butyl group, 2-methylbutyl group, 3-ethylbutyl group and the like. Particularly, methyl group, ethyl group, n-propyl group, isopropyl group, each of which has 1-3 carbon atoms, are preferable, and a methyl group and an ethyl group having 1 or 2 carbon atoms are more preferable.

Examples of the "halogen atom" include fluorine atom, chlorine atom, bromine atom, iodine atom and the like. Among these, fluorine atom, bromine atom and chlorine atom are preferable.

The "alicyclic hydrocarbon group having 3-12 carbon atoms" may be a saturated hydrocarbon group or an unsaturated hydrocarbon group, and is preferably a saturated hydrocarbon group. Examples thereof include cyclopropyl group, cyclobutyl group, cyclopentyl group, cyclohexyl group, cycloheptyl group, cyclooctyl group, cyclononyl group, cyclodecyl group, cyclohexylcyclohexyl group, decahydronaphthyl group, norbornyl group, adamantyl group, isobornyl group and the like. Among these, cyclohexyl group, cycloheptyl group, cyclooctyl group and norbornyl group, each having 6-8 carbon atoms, are preferable, cyclohexyl group and norbornyl group are more preferable, and norbornyl group is further preferable.

The "alkoxy group having 1-6 carbon atoms" is a linear or branched alkoxy group. Examples thereof include methoxy group, ethoxy group, n-propoxy group, n-butoxy group, n-pentyloxy group, n-hexyloxy group, n-methoxyethoxy group, n-ethoxyethoxy group, n-methoxyethoxyethoxy group and n-ethoxyethoxyethoxy group. Preferred are methoxy group, ethoxy group and n-propoxy group, and more preferred is ethoxy group.

Examples of the phenyl group (a part or all of hydrogen atom is optionally substituted by a halogen atom or an alkoxy group) include phenyl group, p-fluorophenyl group, p-chlorophenyl group, 3,5-difluorophenyl group, pentafluorophenyl group, o-methoxyphenyl group, m-methoxyphenyl group, p-methoxyphenyl group, p-ethoxyphenyl group, p-propoxyphenyl group, p-butoxyphenyl group, p-pentyloxyphenyl group, p-hexyloxyphenyl group, 3,5-dimethoxyphenyl group, p-ethoxymethoxyphenyl group, p-ethoxyethoxyphenyl group, p-methoxyethoxyphenyl group and the like. More preferred are phenyl group, p-fluorophenyl group, p-methoxyphenyl group, p-hexyloxyphenyl group and p-ethoxyethoxyphenyl group, and further preferred are phenyl group and p-methoxyphenyl group.

Examples of the phenylalkoxy group (a part or all of hydrogen atom is optionally substituted by a halogen atom or an alkoxy group) include benzyloxy group, phenylethoxy group, benzyloxyethoxy group, benzyloxyethoxyethoxy group, phenylethoxyethoxy group, phenylethoxypropoxy group, phenylpropoxyethoxy group, phenylpropoxypropoxy group, p-fluorobenzyloxy group, 3,5-difluorobenzyloxy group, p-methoxybenzyloxy group, 3,5-dimethoxybenzyloxy group and the like can be mentioned, preferably benzyloxy group, phenylethoxy group, p-fluorobenzyloxy group and p-methoxybenzyloxy group. More preferred are benzyloxy group and phenylethoxy group.

Examples of the phenylalkylcarbamate group (a part or all of hydrogen atom is optionally substituted by a halogen atom or an alkoxy group) include benzylcarbamate group, p-fluorobenzylcarbamate group, 3,5-difluorobenzylcarbamate group, p-methoxybenzylcarbamate group, 3,5-dimethoxybenzylcarbamate group, p-methoxybenzylcarbamate group, 3,5-dimethoxybenzylcarbamate group, phenylethylcarbamate group and phenylpropylcarbamate group. Preferred is benzylcarbamate group.

Preferable examples of the substituent $R^2$ include unsubstituted alkyl group having 3-12 carbon atoms, and substitution alkyl group having 1-6 carbon atoms wherein a part or all of hydrogen atom is substituted by fluorine atom, chlorine atom, cyclohexyl group, norbornyl group, ethoxy group or cyano group. Particularly preferable examples of the substituent $R^2$ include n-hexyl group, n-dodecyl group, 2,2,2-trifluoroethyl group and the like.

The unit of the formula (III) is an alanine, phenylalanine or N-substituted lysine unit. Among these, N-substituted lysine unit (substituent $R^3$ is $-(CH_2)_4-NHX$ group (wherein X is a benzyloxycarbonyl group optionally substituted by a halogen atom or an alkoxy group, an alkylcarbonyl group optionally substituted by a halogen atom, an allyloxycarbonyl group, a fluorenylalkoxycarbonyl group, a benzenesulfonyl group optionally substituted by an alkyl group or a nitro group, or an alkyloxycarbonyl group) unit) is preferable. X is more preferably 2-chlorobenzyloxycarbonyl group, p-methoxybenzyloxycarbonyl group, benzyloxycarbonyl group, trifluoromethylcarbonyl group or 9-fluorenylmethoxycarbonyl group, more preferably, benzyloxycarbonyl group.

More limited, particular one embodiment of the copolymer is a copolymer wherein, in the formula (I), $R^1$ is a methyl group or a benzyl group, in the formula (II), $R^2$ is an unsubstituted alkyl group having 6-16 carbon atoms or an alkyl group having 1-6 carbon atoms wherein a part or all of hydrogen atom is substituted by a halogen atom or an alicyclic hydrocarbon group having 3-12 carbon atoms and, in the formula (III), $R^3$ is a methyl group, a benzyl group or a —$(CH_2)_4$—NHX group (wherein X is a benzyloxycarbonyl group).

To obtain a polymer showing superior heat resistance, the content ratio of the unit of the formula (I), and the unit of the formula (II) or the unit of the formula (III) in the copolymer ((I)/(II) or (I)/(III)) is preferably 10/90-90/10 in a molar ratio.

When the copolymer is composed of the unit of the formula (I) and the unit of the formula (II), the content ratio of the unit of the formula (I) and the unit of the formula (II) in the copolymer ((I)/(II)) is preferably 10/90-90/10, more preferably 15/85-85/15, still more preferably 15/85-80/20, yet more preferably 15/85-60/40, further preferably 30/70-60/40, yet further preferably 30/70-50/50, in a molar ratio.

When the copolymer is composed of the unit of the formula (I) and the unit of the formula (III), the content ratio of the unit of the formula (I) and the unit of the formula (III) in the copolymer ((I)/(III)) is preferably 10/90-90/10, more preferably 20/80-80/20, further preferably 40/60-60/40, in a molar ratio.

While the polymerization form of the copolymer may be a random copolymer wherein the unit of the formula (I), the unit of the formula (II) or the unit of the formula (III) are present at random, or a block copolymer comprising a block of the unit of the formula (I) and a block of the unit of the formula (II) or the unit of the formula (III), a random copolymer is preferable.

While the molecular weight of the copolymer is not particularly limited, to afford a copolymer showing appropriately controlled intermolecular interaction to express memory property, and suitable for film forming, the weight average molecular weight (Mw) is preferably 1,000-500,000, more preferably 5,000-300,000, further preferably 10,000-200,000.

The number average molecular weight (Mn) is preferably 2,000-50,000, more preferably 2,500-45,000. When the copolymer is composed of the unit of the formula (I) and the unit of the formula (II), the number average molecular weight (Mn) is particularly preferably 3,000-40,000; and when the copolymer is composed of the unit of the formula (I) and the unit of the formula (III), the number average molecular weight (Mn) is particularly preferably 3,500-45,000.

The preparation method of poly α-amino acid in the first embodiment is not particularly limited. When the copolymer is composed of the units of the formula (I) and formula (II), for example, a direct polymerization method including dissolving or suspending N-carboxy-α-glutamic acid-γ-ester anhydride comprising an ester group represented by the formula: —$COOR^1$ wherein $R^1$ is as defined above introduced therein (i.e., N-carboxy-α-glutamic acid-γ-ester anhydride (V) represented by the following formula (V)) and N-carboxy-α-glutamic acid-γ-ester anhydride comprising an ester group represented by the formula: —$COOR^2$ wherein $R^2$ is as defined above introduced therein (i.e., N-carboxy-α-glutamic acid-γ-ester anhydride (VI) represented by the following formula (VI)) at any ratio in an organic solvent or water and adding a necessary amount of a polymerization initiator (direct synthesis method) can be mentioned.

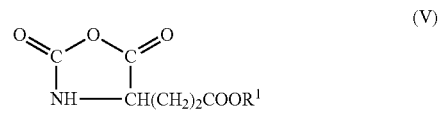

wherein $R^1$ is as defined above,

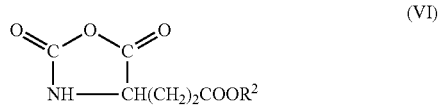

wherein $R^2$ is as defined above.

As another preparation method, a method including dissolving or suspending N-carboxy-α-glutamic anhydride in an organic solvent or water, adding a necessary amount of a polymerization initiator to conduct polymerization to give poly α-glutamic acid, adding an appropriate amount of an alcohol represented by the formula: $R^1$—OH wherein $R^1$ is as defined above, adding a necessary amount of a catalyst to introduce an ester group (—$COOR^1$) into the γ position of a predetermined glutamic acid unit, further adding an appropriate amount of an alcohol represented by the formula: $R^2$—OH wherein $R^2$ is as defined above, and adding a necessary amount of a catalyst to introduce an ester group (—$COOR^2$) into the γ position of the rest of the glutamic acid unit, and a method including dissolving or suspending N-carboxy-α-glutamic acid-γ-ester anhydride (V) represented by the above-mentioned formula (V) or N-carboxy-α-glutamic acid-γ-ester anhydride (VI) represented by the above-mentioned formula (VI) in an organic solvent or water, adding a necessary amount of a polymerization initiator to conduct polymerization to give poly α-glutamic acid-γ-ester, adding an appropriate amount of an alcohol represented by the formula: $R^2$—OH wherein $R^2$ is as defined above or the formula: $R^1$—OH wherein $R^1$ is as defined above, and adding a necessary amount of a catalyst to convert the ester group (—$COOR^1$ or —$COOR^2$) at the γ position to an ester group (—$COOR^2$ or —$COOR^1$) (transesterification method) can be mentioned. To stably afford a poly α-amino acid showing memory property, the direct polymerization method is preferably used for the preparation.

On the other hand, when the copolymer is composed of the unit of the formula (I) and the formula (III), a method including appropriate mixing N-carboxy-α-glutamic anhydride or N-carboxy-α-glutamic acid-γ-ester anhydride (the above-mentioned N-carboxy-α-glutamic acid-γ-ester anhydride (V)), and N-carboxy-α-amino acid anhydride or N-carboxy-α-amino acid derivative anhydride, dissolving or suspending same in an organic solvent or water, and adding a necessary amount of a polymerization initiator to conduct copolymerization can be mentioned.

Here, the N-carboxy-α-amino acid anhydride or N-carboxy-α-amino acid derivative anhydride is an alanine, phenylalanine, N-substituted lysine anhydride, and $N^\epsilon$-benzyloxycarbonyllysine anhydride is more preferable.

Examples of the aforementioned organic solvent include acetone, methyl ethyl ketone, methyl isobutyl ketone, cyclohexanone, tetrahydrofuran, diethyl ether, diisopropyl ether, petroleum ether, 1,4-dioxane, benzene, toluene, xylene, hexane, cyclohexane, ethyl acetate, butyl acetate, trifluoroacetic acid, acetic acid, formic acid, dichloromethane, chloroform, carbon tetrachloride, 1,2-dichloroethane, trichloroethane, trichloroethylene, trifluoroethane, 1,1,1,3,3,3-hexafluoro-2-propanol, 2,2,2-trifluoroethanol, hexafluoroacetone, methanol, ethanol, 1-propanol, 2-propanol, formamide, N,N-dimethylformamide, N,N-dimethylacetamide, N-methylpyrrolidone, dimethyl sulfoxide, pyridine, acetonitrile, trimethylamine, triethylamine, tributylamine and the like. One or more kinds of organic solvents can be used in combination.

Examples of the aforementioned polymerization initiator include primary diamines such as ethylenediamine, propylenediamine, hexamethylenediamine, 1,4-cyclohexanediamine, 1,2-cyclohexanediamine, o-phenylenediamine, m-phenylenediamine, p-phenylenediamine, toluene-2,4-diamine, 4,4'-diphenylmethanediamine, isophoronediamine and the like; primary monoamines such as methylamine, ethylamine, 1-propylamine and the like; alcohol amines such as methanolamine, ethanolamine, diethanolamine and the like; secondary amines such as dimethylamine, diethylamine, dipropylamine and the like; primary tertiary diamines such as N,N-dimethylethylenediamine, N,N-dimethyl-1,3-propanediamine and the like; tertiary amines such as trimethylamine, triethylamine, tributylamine and the like; amino group-containing polymers such as polyetherdiamine, polyester diamine and the like; primary alcohols such as methanol, ethanol and the like; secondary alcohols such as isopropanol and the like; glycols such as ethylene glycol, propylene glycol, 1,4-butanediol, hexamethylene glycol and the like; hydroxyl group-containing polymers such as polyetherdiol, polyester diol and the like; thiols and the like. One or more kinds of polymerization initiators can be used in combination.

Examples of the aforementioned catalyst include hydrochloric acid, sulfuric acid, nitric acid, p-toluenesulfonic acid, sodium hydroxide, potassium hydroxide, sodium methoxide, sodium t-butoxide, potassium methoxide, potassium t-butoxide, Cyanide potassium, carbon dioxide, titanium (IV)tetraisopropoxide, 1,3-substituted tetraalkyldistannoxane tin(IV) complex, tetracyanoethylene, 4-dimethylaminopyridine, diphenylammoniumtriflate-trimethylsilyl chloride and the like. One or more kinds of catalysts can be used in combination. It is preferably p-toluenesulfonic acid in view of efficiency and easy handlability.

The catalytic amount is appropriately determined according to the reaction. Generally, it can be appropriately selected from the range that can realize an appropriate reaction time, and does not make removal of the catalyst after reaction difficult. For example, it is 0.0001-1 equivalent, preferably 0.01-0.75 equivalent, more preferably 0.1-0.5 equivalent, relative to the number of moles of the amino acid anhydride to be used. To obtain a poly α-amino acid showing stable memory property, it is preferable that the residual catalyst after polymerization be substantially void.

The amount of the alcohol to be the starting material is appropriately determined according to the reaction. Generally, it can be appropriately selected from the range that can realize sufficient conversion of the side chain, and does not make removal of unreacted alcohol after the reaction difficult. For example, it may be 0.01-50 equivalents, preferably 0.1-25 equivalents, more preferably 0.15-20 equivalents, relative to the glutamic acid unit of poly α-amino acid.

In the present specification, the "γ-ester-glutamic acid", "glutamic acid-γ-ester" and "γ-ester-glutamate" mean the same.

Particularly preferable specific examples of the poly α-amino acid used in the first embodiment of the present invention include the following.

Examples of the copolymer composed of the unit of the formula (I) and the unit of the formula (II) include γ-methyl-L-glutamic acid/γ-propyl-L-glutamic acid copolymer, γ-methyl-L-glutamic acid/γ-hexyl-L-glutamic acid copolymer, γ-benzyl-L-glutamic acid/γ-hexyl-L-glutamic acid copolymer, γ-methyl-L-glutamic acid/γ-octyl-L-glutamic acid copolymer, γ-methyl-L-glutamic acid/γ-nonyl-L-glutamic acid copolymer, γ-methyl-L-glutamic acid/γ-dodecyl-L-glutamic acid copolymer, γ-benzyl-L-glutamic acid/γ-dodecyl-L-glutamic acid copolymer, γ-methyl-L-glutamic acid/γ-2,2,2-trifluoroethyl-L-glutamic acid copolymer, γ-methyl-L-glutamic acid/γ-2-norbornylmethyl-L-glutamic acid copolymer, γ-benzyl-L-glutamic acid/γ-2-norbornylmethyl-L-glutamic acid copolymer, γ-methyl-L-glutamic acid/γ-2-ethoxyethyl-L-glutamic acid copolymer, γ-methyl-L-glutamic acid/γ-6-chlorohexyl-L-glutamic acid copolymer, γ-methyl-L-glutamic acid/γ-2-cyclohexylethyl-L-glutamic acid copolymer, γ-methyl-L-glutamic acid/γ-((S)-3-methyl-1-pentyl)-L-glutamic acid copolymer, γ-methyl-L-glutamic acid/γ-2-cyanoethyl-L-glutamic acid copolymer and the like.

Examples of the more limited embodiment include γ-methyl-L-glutamic acid (15-85 mol %)/γ-hexyl-L-glutamic acid (15-85 mol %) copolymer, γ-methyl-L-glutamic acid (40-60 mol %)/γ-dodecyl-L-glutamic acid (40-60 mol %) copolymer, γ-benzyl-L-glutamic acid (40-60 mol %)/γ-dodecyl-L-glutamic acid (40-60 mol %) copolymer, γ-methyl-L-glutamic acid (30-70 mol %)/γ-2,2,2-trifluoroethyl-L-glutamic acid (30-70 mol %) copolymer, γ-methyl-L-glutamic acid (40-60 mol %)/γ-2-norbornylmethyl-L-glutamic acid (40-60 mol %) copolymer, and γ-benzyl-L-glutamic acid (40-60 mol %)/γ-2-norbornylmethyl-L-glutamic acid (40-60 mol %) copolymer.

As the copolymer composed of the unit of the formula (I) and the unit of the formula (III), γ-methyl-L-glutamic acid/$N^\epsilon$-benzyloxycarbonyl-L-lysine copolymer, γ-benzyl-L-glutamic acid/$N^\epsilon$-benzyloxycarbonyl-L-lysine copolymer, γ-methyl-L-glutamic acid/L-phenylalanine copolymer, γ-benzyl-L-glutamic acid/L-phenylalanine copolymer, γ-benzyl-L-glutamic acid/L-alanine copolymer, γ-methyl-L-glutamic acid-$N^\epsilon$-benzyloxycarbonyl-L-lysine block copolymer, γ-methyl-L-glutamic acid-$N^\epsilon$-benzyloxycarbonyl-L-lysine-γ-methyl-L-glutamic acid block copolymer, and γ-benzyl-L-glutamic acid-$N^\epsilon$-benzyloxycarbonyl-L-lysine block copolymer are preferable.

Examples of the more limited embodiment include γ-methyl-L-glutamic acid (20-80 mol %)/$N^\epsilon$-benzyloxycarbonyl-L-lysine (20-80 mol %) copolymer, γ-benzyl-L-glutamic acid (40-60 mol %)/$N^\epsilon$-benzyloxycarbonyl-L-lysine (40-60 mol %) copolymer, γ-methyl-L-glutamic acid (40-60 mol %)/L-phenylalanine (40-60 mol %) copolymer, γ-benzyl-L-glutamic acid (40-60 mol %)/L-phenylalanine (40-60 mol %) copolymer, and γ-benzyl-L-glutamic acid (40-60 mol %)/L-alanine (40-60 mol %) copolymer.

The poly α-amino acid (A-2) which is the second embodiment used in the present invention is
a homopolymer composed of a glutamic acid-γ-ester unit represented by the formula (IV):

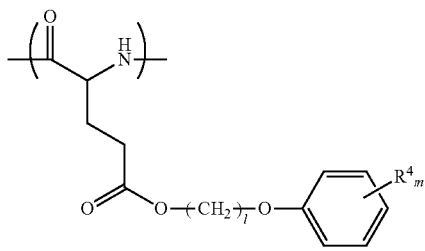

wherein $R^4$ is an alkyl group having 1-12 carbon atoms wherein a part or all of hydrogen atom is substituted by a halogen atom, $R^4$ in the number of m may be the same or different, l is an integer of 6-12, and m is an integer of 1-3, or a copolymer composed of a glutamic acid-γ-ester unit of the formula (IV) and the aforementioned unit of the formula (I).

When the copolymer is composed of the unit of the formula (IV) and the unit of the formula (I), the content of the unit of the formula (IV) is not less than 40 mol % of the copolymer as a whole to achieve high heat resistance. The content of the unit of the formula (IV) is preferably not less than 45 mol %, more preferably not less than 60 mol %, further preferably not less than 80 mol %, especially preferably not less than 85 mol %, most preferably not less than 90 mol %.

When it is a copolymer, while the polymerization form thereof may be a random copolymer wherein the unit of the formula (IV) and the unit of the formula (I) are present at random, or a block copolymer comprising a block of the unit of the formula (IV) and a block of the unit of the formula (I), a random copolymer is preferable.

The alkoxy group having 1-12 carbon atoms for $R^4$ in the formula (IV) is a linear or branched alkoxy group. Examples thereof include methoxy group, ethoxy group, n-propoxy group, n-butoxy group, n-pentyloxy group, n-hexyloxy group, n-heptyloxy group, n-octyloxy group, n-nonyloxy group, n-decyloxy group, n-undecyloxy group, n-dodecyloxy group, isopropoxy group, sec-butoxy group, tert-butoxy group, 2-ethylhexyloxy group, tert-octyloxy group and the like. Among these, methoxy group, ethoxy group, n-propyl group, n-butoxy group, n-pentyloxy group, n-hexyloxy group, isopropoxy group, sec-butoxy group, tert-butoxy group and the like, each having 1-6 carbon atoms, are preferable.

The alkyl group having 1-12 carbon atoms, wherein a part or all of hydrogen atom is substituted by a halogen atom, for $R^4$ is a linear or branched alkyl group. Examples of the halogen atom include fluorine atom, chlorine atom, bromine atom, iodine atom and the like, with preference given to fluorine atom. Examples of the halogen-substituted alkyl group include monofluoromethyl group, difluoromethyl group, trifluoromethyl group, trifluoroethyl group, trifluorodimethylethyl group, hexafluoroisopropyl group, pentafluoroethyl group, trifluorobutyl group, pentafluorobutyl group, heptafluorobutyl group, nonafluorobutyl group, trifluoropentyl group, trifluoroheptyl group, trifluorooctyl group, trifluorononyl group, trifluorodecyl group, trifluoroundecyl group, trifluorododecyl group, pentafluoropentyl group, heptafluoropentyl group, octafluoropentyl group, nonafluoropentyl group, dodecafluorohexyl group, tridecafluorohexyl group, heptadecafluorooctyl group, henicosafluoroundecyl group, heptadecafluoroundecyl group, henicosafluorodecyl group, henicosafluorododecyl group, trichloromethyl group, trichloroethyl group, tribromomethyl group, tribromoethyl group, triiodomethyl group, triiodoethyl group and the like. Among these, trifluoromethyl group and trifluoroethyl group are preferable.

The alkylcarbonyl group wherein the alkyl group has 1-12 carbon atoms for $R^4$ is a linear or branched. Examples thereof include methylcarbonyl, ethylcarbonyl, n-propylcarbonyl, isopropylcarbonyl, n-butylcarbonyl, isobutylcarbonyl, tert-butylcarbonyl, sec-butylcarbonyl, n-pentylcarbonyl, isopentylcarbonyl, neopentylcarbonyl, n-hexylcarbonyl, isohexylcarbonyl, 3-methylpentylcarbonyl, n-heptylcarbonyl, n-octylcarbonyl, n-nonylcarbonyl, n-decylcarbonyl, n-undecylcarbonyl, n-dodecylcarbonyl and the like. Among these, n-propylcarbonyl, isopropylcarbonyl, n-butylcarbonyl, isobutylcarbonyl, tert-butylcarbonyl, sec-butylcarbonyl, n-pentylcarbonyl, isopentylcarbonyl, neopentylcarbonyl, n-hexylcarbonyl, isohexylcarbonyl, n-heptylcarbonyl, n-octylcarbonyl and the like, wherein the alkyl group has 3-9 carbon atoms, is preferable.

In the formula (IV), l is an integer of 6-12, preferably 6-10, m is an integer of 1-3, preferably 1 or 2. When m is 2 or 3, $R^4$ in the number of 2 or 3 may be the same or different, preferably the same.

A more limited, particular one embodiment of the copolymer is a copolymer wherein, in the formula (IV), $R^4$ is an alkoxy group having 1-12 carbon atoms, an alkyl group having 1-12 carbon atoms wherein a part or all of hydrogen atom is substituted by a halogen atom, or an alkylcarbonyl group wherein the alkyl group has 1-12 carbon atoms.

The preparation method of the poly α-amino acid in the second embodiment is not particularly limited.

When it is a homopolymer composed of a glutamic acid-γ-ester unit of the formula (IV), for example, a direct polymerization method including dissolving or suspending an N-carboxy-α-glutamic acid-γ-ester anhydride comprising an ester group represented by the formula: —COOR$^5$ wherein R$^5$ is

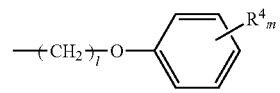

wherein $R^4$, l and m are as defined above, introduced therein (i.e., N-carboxy-α-glutamic acid-γ-ester anhydride (VII) represented by the following formula (VII)) in an organic solvent or water, and adding a necessary amount of a polymerization initiator (direct synthesis method) can be mentioned.

wherein R$^5$ is

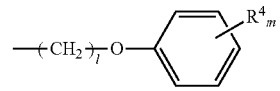

wherein $R^4$, l and m are as defined above.

When it is a copolymer composed of a glutamic acid-γ-ester unit of the formula (IV) and the aforementioned unit of the formula (I), for example, a direct polymerization method including dissolving or suspending N-carboxy-α-glutamic acid-γ-ester anhydride (VII) represented by the above-mentioned formula (VII) and N-carboxy-α-glutamic acid-γ-ester anhydride (V) represented by the aforementioned formula (V) at any ratio in an organic solvent or water and adding a necessary amount of a polymerization initiator (direct synthesis method) can be mentioned.

As another preparation method, a method including dissolving or suspending N-carboxy-α-glutamic anhydride in an organic solvent or water, adding a necessary amount of a polymerization initiator to conduct polymerization to give poly α-glutamic acid, adding an appropriate amount of an alcohol represented by the formula: $R^5$—OH wherein $R^5$ is as defined above, adding a necessary amount of a catalyst to introduce an ester bond-containing group (—$COOR^5$) into the γ position of a predetermined glutamic acid unit, further adding an appropriate amount of an alcohol represented by the formula: $R^1$—OH wherein $R^1$ is as defined above, and adding a necessary amount of a catalyst to introduce an ester group (—$COOR^1$) into the γ position of the rest of the glutamic acid unit, and a method including dissolving or suspending N-carboxy-α-glutamic acid-γ-ester anhydride (VII) represented by the above-mentioned formula (VII) or N-carboxy-α-glutamic acid-γ-ester anhydride (V) represented by the above-mentioned formula (V) in an organic solvent or water, adding a necessary amount of a polymerization initiator to conduct polymerization to give poly α-glutamic acid-γ-ester, adding an appropriate amount of an alcohol represented by the formula: $R^1$—OH wherein $R^1$ is as defined above or the formula: $R^5$—OH wherein $R^5$ is as defined above, and adding a necessary amount of a catalyst to convert the ester group (—$COOR^5$ or —$COOR^1$) at the γ position to an ester group (—$COOR^1$ or —$COOR^5$) (transesterification method) can be mentioned. To stably afford a poly α-amino acid showing memory property, the direct polymerization method is preferably used for the preparation.

In the preparation method of the poly α-amino acid in the second embodiment, as the organic solvent, polymerization initiator and catalyst, those similar to them in the preparation method of the poly α-amino acid in the first embodiment can be used.

Particularly preferable specific examples of poly α-amino acid in the second embodiment include the following.

For example, γ-(6-(p-methoxyphenoxy)-1-hexyl)-L-glutamic acid polymer, γ-methyl-L-glutamic acid/γ-(6-(p-methoxyphenoxy)-1-hexyl)-L-glutamic acid copolymer, γ-(6-(p-pentylcarbonylphenoxy)-1-hexyl)-L-glutamic acid polymer, γ-methyl-L-glutamic acid/γ-(6-(p-pentylcarbonylphenoxy)-1-hexyl)-L-glutamic acid copolymer, γ-methyl-L-glutamic acid/γ-(10-(p-methoxyphenoxy)-1-decyl)-L-glutamic acid copolymer, γ-methyl-L-glutamic acid/γ-(6-(p-butoxy phenoxy)-1-hexyl)-L-glutamic acid copolymer, γ-methyl-L-glutamic acid/γ-(6-(p-hexyloxyphenoxy)-1-hexyl)-L-glutamic acid copolymer, γ-methyl-L-glutamic acid/γ-(6-(3,5-bis(trifluoromethyl)phenoxy)-1-hexyl)-L-glutamic acid copolymer and the like are preferable.

Examples of the more limited embodiment include γ-methyl-L-glutamic acid (<1 mol %)/γ-(6-(p-methoxyphenoxy)-1-hexyl)-L-glutamic acid (>99 mol %) copolymer, γ-methyl-L-glutamic acid (<1 mol %)/γ-(6-(p-hexanoylphenoxy)-1-hexyl)-L-glutamic acid (>99 mol %) copolymer, γ-methyl-L-glutamic acid (0-16 mol %)/γ-(10-(p-methoxyphenoxy)-1-decyl)-L-glutamic acid (84-100 mol %) copolymer, γ-methyl-L-glutamic acid (0-8 mol %)/γ-(6-(p-butoxy phenoxy)-1-hexyl)-L-glutamic acid (92-100 mol %) copolymer, γ-methyl-L-glutamic acid (0-14 mol %)/γ-(6-(p-hexyloxyphenoxy)-1-hexyl)-L-glutamic acid (86-100 mol %) copolymer, and γ-methyl-L-glutamic acid (0-8 mol %)/γ-(6-(3,5-bis(trifluoromethyl)phenoxy)-1-hexyl)-L-glutamic acid (92-100 mol %) copolymer.

While the molecular weight of the poly α-amino acid in the second embodiment is not particularly limited, to afford a copolymer showing appropriately controlled intermolecular interaction to express memory property, and suitable for film forming, the weight average molecular weight (Mw) is preferably 1,000-500,000, more preferably 5,000-300,000, further preferably 10,000-200,000.

The number average molecular weight (Mn) is preferably 2,000-50,000, more preferably 5,000-50,000, further preferably 10,000-45,000.

The present invention provides a ferroelectric memory element using the above-mentioned poly α-amino acid as a ferroelectric layer.

Two kinds of constitutions are largely proposed for the ferroelectric memory elements. Specifically, they are a method combining a capacitor, which is a ferroelectric substance, and a transistor (capacitor type, or 1T1C type), and a method using a field effect transistor (transistor type, or 1T type). A transistor type ferroelectric memory element is preferable.

Such transistor type ferroelectric memory element is preferably an element having a form comprising a ferroelectric layer, a gate electrode, a semiconductor layer, a source electrode and a drain electrode configured on a substrate, more preferably, a form comprising a ferroelectric layer, a gate electrode and a semiconductor layer, configured on a substrate, and a source electrode and a drain electrode configured on the semiconductor layer.

A particularly preferable one specific example of the element is the element shown in FIG. 1, wherein a gate electrode 2, the above-mentioned ferroelectric layer 3 and semiconductor layer 4 are successively layered on a substrate 1, and source and drain electrodes 5 are further configured on the semiconductor layer 4.

The ferroelectric layer in the ferroelectric memory element of the present invention can be formed by preparing a polymer solution of the poly α-amino acid of the present invention dissolved in a suitable organic solvent, that is, the poly α-amino acid-containing ink of the present invention, applying same on the substrate, and drying same.

As an application method, a spin coat method, a dip coat method, a drop casting method and the like can be conveniently used. For pattern control, printing techniques such as a screen printing, a gravure printing, an offset printing, a flexo printing, an inkjet printing and the like are preferable. In addition, a printing method called soft lithography such as micro-contact printing, micro-molding and the like is also included similarly in the printing technique.

The drying method is not particularly limited, and various methods such as drying by leaving, drying by a fan drying machine and the like can be used.

As the organic solvent to be used for the poly α-amino acid-containing ink, various solvents can be used. Examples thereof include chlorohydrocarbon solvents such as chlorofoint, dichloromethane, methylene chloride, trichloroethylene, ethylene dichloride, 1,2-dichloroethane, tetrachloroethane, chlorobenzene and the like, fluorine-containing branched alcohol solvents such as perfluoro-tert-butanol, hexafluoro-2-methylisopropanol, 1,1,1,3,3,3-hexafluoroisopropanol and the like, nitrogen-containing polar solvents such as N-methylpyrrolidone, N,N-dimethylformamide, N,N-dimethylacetamide and the like, alkyl ketone solvents such as acetone, methylethyl ketone, diethyl ketone, acetophenone, cyclohexanone and the like, benzoic acid ester solvents such as methyl benzoate, ether benzoate, butyl benzoate and the like, aromatic hydrocarbon solvents such as benzene, toluene, xylene and solvent naphtha and the like, glycol ether solvents such as diethylene glycol monomethylether, triethylene glycol monomethylether, triethylene glycol dimethylether, propylene glycol monomethylether and the like, glycol ester solvents such as methylcellosolveacetate, methoxypropylacetate, carbitol acetate, butyl carbitol acetate and the like, ether solvents such as dimethylether, diethyl ether, dipropylether, tetrahydrofuran, 1,4-dioxane, 1,3-dioxolane, methyl t-butylether and the like, sulfoxide-sulfone solvents such as dimethyl sulfoxide, dimethylsulfone and the like, alcohol-phenol solvents such as methanol, ethanol, propanol, butanol, pentanol, ethylene glycol, propylene glycol, phenol, cresol, polyethylene glycol and the like, hydrocarbon solvents such as normal hexane, cyclohexane, normal heptane, isooctane, normal decane and the like, and the like.

One kind of an organic solvent may be used alone or two or more kinds thereof may be used in a mixture.

One or more kinds selected from the group consisting of chlorohydrocarbon solvents, fluorine-containing branched alcohol solvents, nitrogen-containing polar solvents, hydrocarbon ketone solvents, benzoic acid ester solvents, aromatic hydrocarbon solvents, glycol ether solvents, and glycol ester solvents are preferable.

One or more kinds selected from the group consisting of dichloromethane, chloroform, 1,1,1,3,3,3-hexafluoroisopropanol, methylene chloride, dichloroethane, N-methylpyrrolidone, N,N-dimethylacetamide, methyl ethyl ketone, cyclohexanone, methyl benzoate, toluene, triethylene glycol dimethylether, acetone, and butyl carbitol acetate are more preferable.

While the concentration of the poly α-amino acid in the poly α-amino acid-containing ink is not particularly limited as long as uniform film forming can be achieved, it is preferably 1-20 wt %, more preferably 5-15 wt %.

To obtain a ferroelectric layer showing stable memory property, the poly α-amino acid-containing ink is preferably substantially free of a catalyst used for synthesizing poly α-amino acid (e.g., the aforementioned catalysts such as p-toluenesulfonic acid etc.). The concentration of the residual catalyst is preferably not more than 6.0 wt %, more preferably not more than 1.0 wt %, further preferably not more than 0.5 mol %, still more preferably not more than 0.1 wt %.

While the rotation number of the spin coat is not particularly limited, it is preferably 1,000-5,000 rpm. While the film forming temperature is not particularly limited, it is preferably 10-150° C., more preferably 20-100° C.

The thickness of the ferroelectric layer composed of poly α-amino acid is preferably 300-1,000 nm, more preferably 500-1,000 nm.

The substrate is not particularly limited, and glass substrates such as quartz and the like, semiconductor substrates such as silicon wafer and the like, flexible plastic substrates such as polycarbonate, polyimide, poly(ethylene terephthalate) (PET) and the like, paper and the like can be mentioned.

As a material of the gate electrode, drain electrode and source electrode, a metal such as gold, copper and the like is often used but is not limited thereto. The production method thereof is not particularly limited, and any method can be used. A method generally used is plate wiring and the like. In addition, wet production processes including application or attachment of a solution, such as typographical printing, screen printing, ink jet printing and the like, and the like are also applied. In this case, a silver plate, as well as an electrode made of an organic material such as thiophene conductive polymer (PEDOT), polyaniline and derivatives thereof and the like can be used as a gate electrode, a drain electrode and a source electrode. Moreover, a dry production process different from the above such as a vacuum vapor deposition method, a sputtering method and the like can also be applied. Furthermore, to afford stabilization, lifetime improvement, high charge injecting efficiency and the like of the element, the gate electrode can also be famed from a mixture of plural substances, have a layer structure of several kinds of substances, or can be applied with a surface treatment.

An organic semiconductor material is used as the semiconductor layer. The composition thereof is not particularly limited, and it may be composed of a single substance or a mixture of plural substances. Furthermore, it may have a layer structure of several kinds of substances. As organic semiconductor materials showing superior property, anthracene, tetracene, pentacene and derivatives thereof having a substituted terminal; α-sexthiophene; perylenetetracarboxylic dianhydride (PTCDA) and derivatives thereof having a substituted terminal; naphthalenetetracarboxylic dianhydride (NTCDA) and a derivative thereof having a substituted terminal; copper phthalocyanine and a derivative thereof having a terminal substituted by fluorine and the like; a derivative of copper phthalocyanine wherein the copper is substituted by nickel, titanium oxide, aluminum fluoride etc. and derivatives wherein each terminal is substituted by fluorine and the like; fullerene, rubrene, coronene, anthradithiophene and derivatives thereof having substituted terminals thereof; polymers of polyphenylenevinylene, polythiophene, polyfluorene, polyphenylene, polyacetylene and derivatives thereof having substituted terminals or side chain, and the like are heretofore known, and they are applied to a semiconductor layer.

The production method of the semiconductor layer is not particularly limited, and any method can be used. Generally, a gaseous phase growth method such as vacuum vapor deposition and the like is often used. In view of convenient and low cost production, a printing method including application of a solution obtained by mixing a material with a solvent and the like, such as screen printing, inkjet printing and the like, is applied for the production. In addition, a printing method called soft lithography such as micro-contact printing, micro-molding and the like can also be applied.

While the foregoing shows a transistor type ferroelectric memory element, poly α-amino acid can also be used as a ferroelectric substance for a capacitor type ferroelectric memory element.

Conventionally-known apparatuses and systems can be applied to the control of the WRITE and READ operation of the ferroelectric memory element of the present invention, and it is not particularly limited.

The ferroelectric memory element of the present invention shows memory property at 100° C. That is, as is clear from the below-mentioned Examples, it shows good memory property at not less than 100° C., particularly, good memory property even at 150° C., and a ferroelectric memory element superior in the operational stability can be realized even when exposed to a high temperature. Such memory property at a high temperature is an advantage of the ferroelectric memory element of the present invention.

Figure 4:
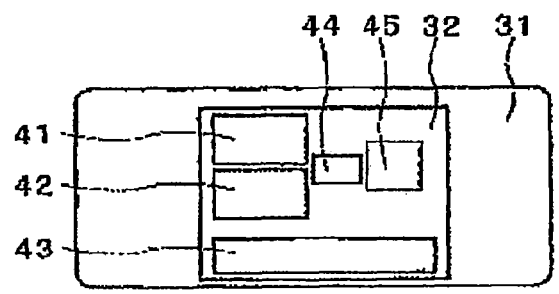
FIG. 4 is a schematic view of one embodiment of an RFID tag using the ferroelectric memory element of the present invention.

The ferroelectric memory element of the present invention is useful for an RFID (Radio Frequency Identification) tag. FIG. 4 is a schematic view showing one embodiment of an RFID tag having the ferroelectric memory element of the present invention. A substrate 32 is formed on a substrate 31 having the shape of a tag. This substrate 32 is an economical substrate solution on glass with a small alkali metal content, quartz or a plastic material such as polycarbonate or polyimide and the like, and the like. On the substrate 32 are integrally provided a received data encoding circuit 41, a transmission data encoding circuit 42, an antenna element 43 for transmission and reception of data from the outside, a ferroelectric memory element 45 for storing data and a control circuit 44 that controls these operations.

Figure 5:
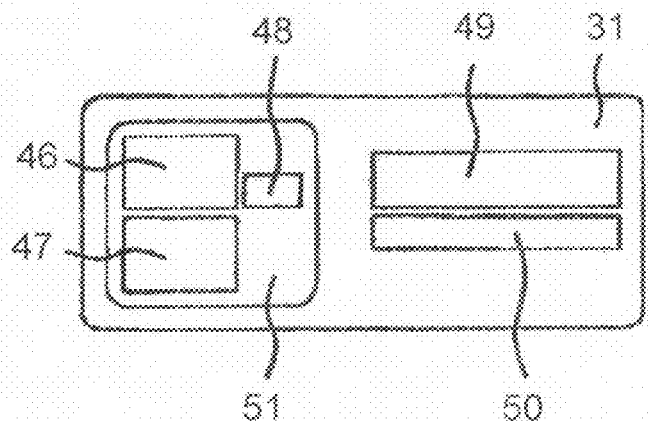
FIG. 5 is a schematic view of other embodiment of an RFID tag using the ferroelectric memory element of the present invention.

FIG. 5 is a schematic view showing other embodiment of an RFID tag having the ferroelectric memory element of the present invention. In this RFID tag, an IC chip formed on a monocrystal silicon substrate 51 by a general LSI process, a ferroelectric memory element 49 and an antenna element 50 are provided on a substrate 31. IC chip contains a received data encoding circuit 46, a transmission data encoding circuit 47, and a control element 48 formed on the monocrystal silicon substrate 51.

An RFID tag using the ferroelectric memory element of the present invention can realize a highly reliable RFID tag, since the ferroelectric memory element is superior in the operational stability at high temperature.

EXAMPLES

The present invention is explained in more detail in the following by referring to Examples and Comparative Examples, which are not to be construed as limitative.

Synthesis of poly α-amino acid

Synthetic Example 1

Synthesis of γ-methyl-L-glutamic acid/γ-hexyl-L-glutamic acid copolymer (transesterification method)

(step 1) Synthesis of poly-γ-methyl-L-glutamic acid (precursor polymer)

To 1,2-dichloroethane (410 ml, manufactured by KANTO CHEMICAL Co. Ltd.) was added N-carboxy-γ-methyl-L-glutamic anhydride (54.92 g, 293.45 mmol), and the mixture was cooled to 0° C. As an initiator, N,N-dimethyl-1,3-propanediamine (366 µl, 2.93 mmol, manufactured by KANTO CHEMICAL Co., Ltd.) was added, and the mixture was stirred at 25° C. for 1 day to give poly-γ-methyl-L-glutamic acid.

(step 2) Side chain substitution reaction of poly-γ-methyl-L-glutamic acid (transesterification reaction)

Poly-γ-methyl-L-glutamic acid (9.3 g) prepared above was dissolved in 1,2-dichloroethane (45 ml), and 1-hexanol (16 ml, 130.00 mmol, manufactured by Tokyo Chemical Industry Co., Ltd.) and p-toluenesulfonic acid monohydrate (1.24 g, 6.50 mmol, manufactured by Tokyo Chemical Industry Co., Ltd.) were added. The mixture was stirred at 80° C. for 1 day to perform a transesterification reaction to give a γ-methyl-L-glutamic acid/γ-hexyl-L-glutamic acid copolymer. As for the obtained copolymer, the molecular weight of the copolymer was measured by the following method (measurement method 1). In addition, the composition ratio after the transesterification reaction was measured by the following method (measurement method 2).

Synthetic Example 9

Synthesis of γ-benzyl-L-glutamic acid/γ-dodecyl-L-glutamic acid copolymer (transesterification method)

(step 1) Synthesis of poly-γ-benzyl-L-glutamic acid (precursor polymer)

To 1,2-dichloroethane (265 ml, manufactured by KANTO CHEMICAL Co., Ltd.) were added N-carboxy-γ-benzyl-L-glutamic anhydride (44.2 g, 167.98 mmol) and N,N-dimethyl-1,3-propanediamine (208.2 µl, 1.68 mmol) as an initiator, and the mixture was stirred at 25° C. for 3 days to give poly-γ-benzyl-L-glutamic acid. The weight average molecular weight Mw and number average molecular weight Mn were measured by the following method (measurement method 1).

(step 2) Side chain substitution reaction of poly-γ-benzyl-L-glutamic acid (transesterification reaction)

Poly-γ-benzyl-L-glutamic acid (10 g, 45.6 mmol) prepared above was dissolved in 1,2-dichloroethane (170 ml), and 1-dodecanol (10.2 ml, 45.6 mmol, manufactured by Tokyo Chemical Industry Co., Ltd.) and p-toluenesulfonic acid monohydrate (2.6 g, 13.68 mmol) were added. The mixture was stirred at 65° C. for 1 day to give a γ-benzyl-L-glutamic acid/γ-dodecyl-L-glutamic acid copolymer. The obtained copolymer was measured for the molecular weight by the following method (measurement method 1). In addition, the composition ratio after the transesterification reaction was measured by the following method (measurement method 2).

Synthetic Examples 2-8 and 10-24

Synthesis of various poly α-amino acids

According to a method similar to Synthetic Example 1 or 9, poly-γ-methyl-L-glutamic acid or poly-γ-benzyl-L-glutamic acid was obtained, which was then dissolved in 1,2-dichloroethane. Alcohol shown in Table 1 (column of introduced alcohol) was added in an appropriate amount relative to the glutamic acid unit of poly-γ-methyl-L-glutamic acid or poly-γ-benzyl-L-glutamic acid, a catalytic amount of p-toluenesulfonic acid monohydrate was added, and the mixture was stirred for 1-5 days to give various poly α-amino acids (copolymers). The obtained copolymers were measured for the molecular weight by the following method (measurement method 1). In addition, the composition ratio after the transesterification reaction was measured by the following method (measurement method 2).

TABLE 1

| | polymer (composition: mol %) | precursor polymer | introduced alcohol | Mw | Mn |
|---|---|---|---|---|---|
| Syn. Ex. 1 | γ-methyl-L-glutamic acid (37%)/γ-hexyl-L-glutamic acid (63%) copolymer | poly-γ-methyl-L-glutamic acid | 1-hexanol | $2.1 \times 10^4$ | $9.4 \times 10^3$ |
| Syn. Ex. 2 | γ-methyl-L-glutamic acid (18%)/γ-hexyl-L-glutamic acid (82%) copolymer | poly-γ-methyl-L-glutamic acid | 1-hexanol | $3.2 \times 10^4$ | $5.6 \times 10^3$ |
| Syn. Ex. 3 | γ-methyl-L-glutamic acid (46%)/γ-hexyl-L-glutamic acid (54%) copolymer | poly-γ-methyl-L-glutamic acid | 1-hexanol | $2.6 \times 10^6$ | $1.8 \times 10^5$ |
| Syn. Ex. 4 | γ-benzyl-L-glutamic acid (60%)/γ-hexyl-L-glutamic acid (40%) copolymer | poly-γ-benzyl-L-glutamic acid | 1-hexanol | $2.5 \times 10^4$ | $1.6 \times 10^4$ |
| Syn. Ex. 5 | γ-methyl-L-glutamic acid (50%)/γ-propyl-L-glutamic acid (50%) copolymer | poly-γ-methyl-L-glutamic acid | 1-propanol | $1.5 \times 10^4$ | $5.4 \times 10^3$ |
| Syn. Ex. 6 | γ-methyl-L-glutamic acid (47%)/γ-octyl-L-glutamic acid (53%) copolymer | poly-γ-methyl-L-glutamic acid | 1-octanol | $1.4 \times 10^4$ | $8.1 \times 10^3$ |
| Syn. Ex. 7 | γ-methyl-L-glutamic acid (47%)/γ-nonyl-L-glutamic acid (53%) copolymer | poly-γ-methyl-L-glutamic acid | 1-nonanol | $21.6 \times 10^4$ | $8.8 \times 10^3$ |
| Syn. Ex. 8 | γ-methyl-L-glutamic acid (50%)/γ-dodecyl-L-glutamic acid (50%) copolymer | poly-γ-methyl-L-glutamic acid | 1-dodecanol | $2.9 \times 10^4$ | $1.3 \times 10^4$ |
| Syn. Ex. 9 | γ-benzyl-L-glutamic acid (60%)/γ-dodecyl-L-glutamic acid (40%) copolymer | poly-γ-benzyl-L-glutamic acid | 1-dodecanol | $2.0 \times 10^4$ | $1.3 \times 10^4$ |
| Syn. Ex. 10 | γ-methyl-L-glutamic acid (67%)/γ-2,2,2-trifluoroethyl-L-glutamic acid (33%) copolymer | poly-γ-methyl-L-glutamic acid | 2,2,2-trifluoroethanol | $3.2 \times 10^4$ | $5.9 \times 10^3$ |
| Syn. Ex. 11 | γ-methyl-L-glutamic acid (40%)/γ-2-norbornylmethyl-L-glutamic acid (60%) copolymer | poly-γ-methyl-L-glutamic acid | norbornane-2-methanol | $2.6 \times 10^4$ | $1.1 \times 10^4$ |
| Syn. Ex. 12 | γ-benzyl-L-glutamic acid (55%)/γ-2-norbornylmethyl-L-glutamic acid (45%) copolymer | poly-γ-benzyl-L-glutamic acid | norbornane-2-methanol | $2.2 \times 10^4$ | $6.3 \times 10^3$ |
| Syn. Ex. 13 | γ-methyl-L-glutamic acid (59%)/γ-2-ethoxyethyl-L-glutamic acid (41%) copolymer | poly-γ-methyl-L-glutamic acid | 2-ethoxyethanol | $1.6 \times 10^4$ | $6.8 \times 10^3$ |
| Syn. Ex. 14 | γ-methyl-L-glutamic acid (49%)/γ-6-chlorohexyl-L-glutamic acid (51%) copolymer | poly-γ-methyl-L-glutamic acid | 6-chlorohexanol | $2.7 \times 10^4$ | $1.5 \times 10^4$ |
| Syn. Ex. 15 | γ-methyl-L-glutamic acid (48%)/γ-2-cyclohexylethyl-L-glutamic acid (52%) copolymer | poly-γ-methyl-L-glutamic acid | 2-cyclohexylethanol | $1.2 \times 10^4$ | $6.1 \times 10^3$ |
| Syn. Ex. 16 | γ-methyl-L-glutamic acid (47%)/γ-(S)-3-methyl-1-pentyl-L-glutamic acid (53%) copolymer | poly-γ-methyl-L-glutamic acid | (S)-3-methyl-1-pentanol | $2.5 \times 10^4$ | $9.7 \times 10^3$ |
| Syn. Ex. 17 | γ-methyl-L-glutamic acid (61%)/γ-2-cyanoethyl-L-glutamic acid (39%) copolymer | poly-γ-methyl-L-glutamic acid | 2-cyanoethanol | $1.4 \times 10^4$ | $5.2 \times 10^3$ |
| Syn. Ex. 18 | γ-methyl-L-glutamic acid (<1%)/γ-(6-(p-methoxyphenoxy)-1-hexyl)-L-glutamic acid (>99%) copolymer | poly-γ-methyl-L-glutamic acid | 6-p-methoxyphenoxy-1-hexanol | $1.1 \times 10^5$ | $1.3 \times 10^4$ |
| Syn. Ex. 19 | γ-methyl-L-glutamic acid (49%)/γ-(6-(p-methoxyphenoxy)-1-hexyl)-L-glutamic acid (51%) copolymer | poly-γ-methyl-L-glutamic acid | 6-p-methoxyphenoxy-1-hexanol | $1.8 \times 10^4$ | $1.0 \times 10^4$ |
| Syn. Ex. 20 | γ-methyl-L-glutamic acid (<1%)/γ-(6-(p-pentylcarbonylphenoxy)-1-hexyl)-L-glutamic acid (>99%) copolymer | poly-γ-methyl-L-glutamic acid | 6-p-pentylcarbonylphenoxy-1-hexanol | $9.6 \times 10^4$ | $2.7 \times 10^4$ |
| Syn. Ex. 21 | γ-methyl-L-glutamic acid (16%)/γ-(10-(p-methoxyphenoxy)-1-decyl)-L-glutamic acid (84%) copolymer | poly-γ-methyl-L-glutamic acid | 10-p-methoxyphenoxy-1-decanol | $1.2 \times 10^5$ | $3.3 \times 10^4$ |
| Syn. Ex. 22 | γ-methyl-L-glutamic acid (8%)/γ-(6-(p-butoxy phenoxy)-1-hexyl)-L-glutamic acid (92%) copolymer | poly-γ-methyl-L-glutamic acid | 6-p-butoxy phenoxy-1-hexanol | $1.7 \times 10^5$ | $4.0 \times 10^4$ |
| Syn. Ex. 23 | γ-methyl-L-glutamic acid (14%)/γ-(6-(p-hexyloxyphenoxy)-1-hexyl)-L-glutamic acid (86%) copolymer | poly-γ-methyl-L-glutamic acid | 6-p-hexyloxyphenoxy-1-hexanol | $1.9 \times 10^5$ | $4.3 \times 10^4$ |
| Syn. Ex. 24 | γ-methyl-L-glutamic acid (8%)/γ-(6-(3,5-bis(trifluoromethyl)phenoxy)-1-hexyl)-L-glutamic acid (92%) copolymer | poly-γ-methyl-L-glutamic acid | 6-(3,5-bis(trifluoromethyl)phenoxy)-1-hexanol | $5.0 \times 10^4$ | $2.2 \times 10^4$ |

Synthetic Example 25

Synthesis of γ-methyl-L-glutamic acid/γ-octyl-L-glutamic acid copolymer (direct synthesis method)

To 1,2-dichloroethane (15 ml) were added N-carboxy-γ-methyl-L-glutamic anhydride (1.2 g, 4.21 mmol) and N-carboxy-γ-octyl-L-glutamic anhydride (0.52 g, 2.80 mmol), and the mixture was cooled to 0° C. N,N-dimethyl-1,3-propanediamine (17.64 μl, 0.14 mmol) was added as an initiator, and the mixture was stirred at 25° C. for 1 day to give a γ-methyl-L-glutamic acid/γ-octyl-L-glutamic acid copolymer. The obtained copolymer was measured for the molecular weight by the following method (measurement method 1). In addition, the composition was measured by the following method (measurement method 2). As for the molecular weight, the weight average molecular weight Mw was $1.7 \times 10^4$, and the number average molecular weight Mn was $8.5 \times 10^3$. As for the composition, 40 mol % was γ-methyl-L-glutamic acid and 60 mol % was γ-octyl-L-glutamic acid.

Synthetic Example 26

Synthesis of γ-methyl-L-glutamic acid/$N^\epsilon$-benzyloxycarbonyl-L-lysine copolymer To 1,2-dichloroethane (130 ml) were added N-carboxy-γ-methyl-L-glutamic anhydride (2.46 g, 13.12 mmol) and $N^\alpha$-carboxy-$N^\epsilon$-benzyloxycarbonyl-L-lysine anhydride (4.02 g, 13.12 mmol), and N,N-dimethyl-1,3-propanediamine (32.78 μl, 0.262 mmol) was added as an initiator. The mixture was stirred at 25° C. for 1 day to give a γ-methyl-L-glutamic acid/$N^\epsilon$-benzyloxycarbonyl-L-lysine copolymer. The molecular weight of the copolymer was measured by the following method (measurement method 1). In addition, the composition of the copolymer was measured by the following method (measurement method 2).

Synthetic Examples 27-30

Synthesis of Various Copolymers

In the same manner as in Synthetic Example 26, to 1,2-dichloroethane were added equimolar amounts of two kinds of N-carboxy-L-amino acid anhydrides (component A, component B) shown in Table 2, and 1/100 equivalent amount of N,N-dimethyl-1,3-propanediamine relative to the amino acid anhydride was added as an initiator. The mixtures were stirred for 2-3 days to give various amino acid copolymers. The molecular weight of the copolymer was measured by the following method (measurement method 1). In addition, the composition of the copolymer was measured by the following method (measurement method 2).

Synthetic Example 31

Synthesis of γ-methyl-L-glutamic acid (68%)-N$^\epsilon$-benzyloxycarbonyl-L-lysine (32%) block copolymer To 1,2-dichloroethane (20 ml) was added N-carboxy-γ-methyl-L-glutamic anhydride (5.00 g, 26.72 mmol), and the mixture was cooled to 0° C. N,N-dimethyl-1,3-propanediamine (66.80 μl, 0.534 mmol) was added as an initiator, and the mixture was stirred at 25° C. for 1 day and cooled again to 0° C. 1,2-Dichloroethane (20 ml) was added, N$^\alpha$-carboxy-N$^\epsilon$-benzyloxycarbonyl-L-lysine anhydride (4.09 g, 13.36 mmol) was added, and the mixture was stirred at 25° C. for 1 day to give a γ-methyl-L-glutamic acid-N$^\epsilon$-benzyloxycarbonyl-L-lysine block copolymer. The molecular weight of the copolymer was measured by the following method (measurement method 1). In addition, the composition of the copolymer was measured by the following method (measurement method 2).

Synthetic Example 32

Synthesis of γ-methyl-L-glutamic acid (41%)-N$^\epsilon$-benzyloxycarbonyl-L-lysine (18%)-γ-methyl-L-glutamic acid (41%) block copolymer In the same manner as in Synthetic Example 31, a γ-methyl-L-glutamic acid-N$^\epsilon$-benzyloxycarbonyl-L-lysine block copolymer was obtained and cooled again to 0° C. 1,2-Dichloroethane (10 ml) was added, N-carboxy-γ-methyl-L-glutamic anhydride (5.00 g, 26.72 mmol) was added, and the mixture was stirred at 25° C. for 2 days to give a γ-methyl-L-glutamic acid-N$^\epsilon$-benzyloxycarbonyl-L-lysine-γ-methyl-L-glutamic acid block copolymer. The molecular weight of the copolymer was measured by the following method (measurement method 1). In addition, the composition of the copolymer was measured by the following method (measurement method 2).

Synthetic Example 33

Synthesis of γ-benzyl-L-glutamic acid (50%)-N$^\epsilon$-benzyloxycarbonyl-L-lysine (50%) block copolymer To 1,2-dichloroethane (10 ml) was added N-carboxy-γ-benzyl-L-glutamic anhydride (1.00 g, 3.80 mmol), and the mixture was cooled to 0° C. N,N-dimethyl-1,3-propanediamine (9.56 μl, 0.076 mmol) was added as an initiator, and the mixture was stirred at 25° C. for 1 day. After cooling again to 0° C., N$^\alpha$-carboxy-N$^\epsilon$-benzyloxycarbonyl-L-lysine anhydride (1.16 g, 3.80 mmol) was added, and the mixture was stirred at 25° C. for 1 day to give γ-benzyl-L-glutamic acid-N$^\epsilon$-benzyloxycarbonyl-L-lysine block copolymer. The molecular weight of the copolymer was measured by the following method (measurement method 1). In addition, the composition of the copolymer was measured by the following method (measurement method 2).

TABLE 2

| | | N-carboxy-L-amino acid anhydride | | | |
| --- | --- | --- | --- | --- | --- |
| | polymer (composition: mol %) | component A | component B | Mw | Mn |
| Syn. Ex. 26 | γ-methyl-L-glutamic acid (47%)/N$^\epsilon$-benzyloxycarbonyl-L-lysine (53%) copolymer | γ-methyl-L-glutamic acid | N$^\epsilon$-benzyloxycarbonyl-L-lysine | $5.5 \times 10^4$ | $1.6 \times 10^4$ |
| Syn. Ex. 27 | γ-benzyl-L-glutamic acid (49%)/N$^\epsilon$-benzyloxycarbonyl-L-lysine (51%) copolymer | γ-benzyl-L-glutamic acid | N$^\epsilon$-benzyloxycarbonyl-L-lysine | $3.8 \times 10^4$ | $2.2 \times 10^4$ |
| Syn. Ex. 28 | γ-methyl-L-glutamic acid (51%)/L-phenylalanine (49%) copolymer | γ-methyl-L-glutamic acid | L-phenylalanine | $4.0 \times 10^4$ | $2.1 \times 10^4$ |
| Syn. Ex. 29 | γ-benzyl-L-glutamic acid (48%)/L-phenylalanine (52%) copolymer | γ-benzyl-L-glutamic acid | L-phenylalanine | $1.4 \times 10^5$ | $1.9 \times 10^4$ |
| Syn. Ex. 30 | γ-benzyl-L-glutamic acid (50%)/L-alanine (50%) copolymer | γ-benzyl-L-glutamic acid | L-alanine | $1.5 \times 10^5$ | $5.1 \times 10^3$ |
| Syn. Ex. 31 | γ-methyl-L-glutamic acid (68%)-N$^\epsilon$-benzyloxycarbonyl-L-lysine (32%) block copolymer | γ-methyl-L-glutamic acid | N$^\epsilon$-benzyloxycarbonyl-L-lysine | $1.7 \times 10^4$ | $7.8 \times 10^3$ |
| Syn. Ex. 32 | γ-methyl-L-glutamic acid (41%)-N$^\epsilon$-benzyloxycarbonyl-L-lysine (18%)-γ-methyl-L-glutamic acid (41%) block copolymer | γ-methyl-L-glutamic acid | N$^\epsilon$-benzyloxycarbonyl-L-lysine | $4.8 \times 10^4$ | $2.9 \times 10^4$ |
| Syn. Ex. 33 | γ-benzyl-L-glutamic acid (50%)-N$^\epsilon$-benzyloxycarbonyl-L-lysine (50%) block copolymer | γ-benzyl-L-glutamic acid | N$^\epsilon$-benzyloxycarbonyl-L-lysine | $3.5 \times 10^4$ | $1.3 \times 10^3$ |

[Production of Element]

Using the poly α-amino acid synthesized above, the element shown in FIG. 1 was produced based on the following element production method. A thin film (ferroelectric layer) of poly α-amino acid was formed by spin coating or dip coating.

(Production Method of Element)

A glass substrate 1 (thickness: 1.13 mm) with a patterned ITO electrode (thickness: 120±20 nm, length: 35 mm, width: 7 mm) as a gate electrode 2 was washed by ultrasonication for 15 min with a neutral detergent (manufactured by AS ONE Corporation, Puresoft) diluted 5-fold with pure water. Thereafter, the substrate was washed by ultrasonication with pure water for 15 min to remove the detergent. Thereafter, the substrate was further washed by UV irradiation by a UV-ozone washing machine for 20 min under oxygen atmosphere. Ferroelectric layer 3 was produced by spin coating or dip coating with a poly α-amino acid solution on the thus-washed substrate. Then, a thin film of pentacene was formed thereon as a semiconductor layer 4 by a vacuum vapor deposition method. Pentacene was sublimation purified 5 repeats and used. As for the vacuum vapor deposition conditions, the substrate was fixed above a boat for vapor deposition, the temperature of the substrate was adjusted at 23° C., the degree of vacuum was reduced to $1 \times 10^{-4}$ Torr, and vacuum vapor deposition was performed to a thickness of 50 nm at a rate of 6 nm/min. As source and drain electrodes 5, gold was vacuum vapor deposited using a nickel mask to a size of width (5 mm) and thickness (50 nm). The distance between the source-drain was 20 μm.

Table 3 shows the solvent and the concentration of the polymer of the poly α-amino acid-containing ink of Synthetic Examples used for the formation of a ferroelectric layer 3, and the rotation number (rpm) in the spin coating.

TABLE 3

| polymer | solvent | polymer concentration wt % | rotation number of spin coating (rpm) |
|---|---|---|---|
| Syn. Ex. 1 | chloroform: 1,1,1,3,3,3-hexafluoroisopropanol (9:1) | 5 | 2500 |
| Syn. Ex. 2 | chloroform: 1,1,1,3,3,3-hexafluoroisopropanol (9:1) | 5 | 1000 |
| Syn. Ex. 5 | chloroform | 5 | 2000 |
| Syn. Ex. 6 | 1,2-dichloroethane | 7 | 2000 |
| Syn. Ex. 8 | chloroform | 7 | 2000 |
| Syn. Ex. 9 | chloroform | 7 | 1000 |
| Syn. Ex. 10 | chloroform | 5 | 1000 |
| Syn. Ex. 13 | chloroform | 7 | 2000 |
| Syn. Ex. 14 | chloroform | 5 | 1000 |
| Syn. Ex. 20 | chloroform | 5 | 1500 |
| Syn. Ex. 26 | chloroform | 7.5 | 1000 |
| Syn. Ex. 27 | chloroform | 7 | 3000 |
| Syn. Ex. 31 | 1,2-dichloroethane | 7.5 | 2000 |
| Syn. Ex. 32 | 1,2-dichloroethane | 7.5 | 2000 |

Comparative Example 1

Production of element using poly-γ-methyl-L-glutamic acid

In the element production method, a solution (2.8% (w/w)) of poly-γ-methyl-L-glutamic acid (PMLG, Mn: $2.6 \times 10^4$) in 1,2-dichloroethane was dip coated as a ferroelectric layer 3 at a rate of 1 cm/sec to give a polymer thin film, whereby an element was obtained.

Comparative Example 2

Production of element using poly-γ-benzyl-L-glutamic acid

In the element production method, a solution (5.0% (w/w)) of poly-γ-benzyl-L-glutamic acid (manufactured by Sigma-Aldrich Co. LLC., molecular weight 150,000-350,000) in 1,2-dichloroethane was spin coated as a ferroelectric layer 3 at a rate of 1,000 rpm to give a thin film, whereby an element was obtained.

Comparative Example 3

Production of element using poly-L-arginine

In the element production method, a solution (10.0% (w/w)) of poly-L-arginine hydrochloride (manufactured by Sigma-Aldrich Co. LLC., molecular weight 15,000-70,000) in ultrapure water was spin coated as a ferroelectric layer 3 at a rate of 1,000 rpm to give a thin film, whereby an element was obtained.

[Measurement, Evaluation]

Measurement Method 1: Measurement Method of Weight Average Molecular Weight and Number Average Molecular Weight The weight average molecular weight Mw and number average molecular weight Mn were measured using gel permeation chromatography (GPC). To be specific, an analysis column apparatus (manufactured by Showa Denko K.K., Shodex K-802 and K-806M) was set on an analysis apparatus for GPC (manufactured by Hitachi, Ltd., LaChrom Elite), a measurement solution prepared separately was poured thereinto by 10-80 μl, and the measurement was performed under the conditions of eluent flow rate: 1 ml/min and column maintaining temperature: 40° C. The measurement solution was prepared by dissolving polyamino acid in chloroform to a polyamino acid concentration of 0.25-3.0% (w/v), followed by filtration with a filter. The molecular weight was calculated by comparing the obtained peak retention time with that of calibration polystyrene (manufactured by Showa Denko K.K., Shodex STANDARD SM-105) measured separately.

Measurement Method 2: Measurement Method of Composition of Copolymer

A sample (dozen mg) was dissolved in deuterated chloroform or deuterated trifluoroacetic acid, and $^1$H nuclear magnetic resonance spectrum ($^1$HNMR, BRUKER, 400 MHz) was analyzed. The composition was calculated by comparing the peak areas of the proton at the α-position of amino acid before and after transesterification or during copolymerization. The measurement examples are shown below.

Composition Measurement Example of
γ-methyl-L-glutamic acid/γ-hexyl-L-glutamic acid
copolymer The synthesized copolymer (10 mg) was dissolved in deuterated trifluoroacetic acid and $^1$HNMR was measured. As a result, a peak derived from the methyl group of γ-methyl-L-glutamic acid was detected near 3.8 ppm, and a peak derived from at the α-position proton of γ-methyl-L-glutamic acid and γ-hexyl-L-glutamic acid was detected near 4.7 ppm. When the peak area near 3.8 ppm was A, and the peak area near 4.7 ppm was B, A/B was 1.17. Since A/B=3.00 for poly-γ-methyl-L-glutamic acid, only the decreased amount is considered to have been substituted by a hexyl group. The content percentage of the hexyl group is 61% since 1.83/3.00=0.61. Therefore, the composition ratio of the copolymer is γ-methyl-L-glutamic acid (39%)/γ-hexyl-L-glutamic acid (61%).

Composition Measurement Example of
γ-benzyl-L-glutamic
acid/N$^ε$-benzyloxycarbonyl-L-lysine copolymer The synthesized copolymer (10 mg) was dissolved in deuterated trifluoroacetic acid, and $^1$HNMR was measured. As a result, a peak derived from the benzyl group of γ-benzyl-L-glutamic acid and N$^ε$-benzyloxycarbonyl-L-lysine was detected near 5.1 ppm, a peak derived from the α-position proton of γ-benzyl-L-glutamic acid was detected near 4.7 ppm and a peak derived from the α-position proton of N$^ε$-benzyloxycarbonyl-L-lysine was detected near 4.4 ppm. When the peak areas near 5.1 ppm, 4.7 ppm and 4.4 ppm were A, B and C, respectively, the results were A/B=4.00, A/C=4.00, and B/C=1.00. Since B and C each show the area of one proton, the composition ratio of the copolymer is γ-benzyl-L-glutamic acid (50%)/N$^ε$-benzyloxycarbonyl-L-lysine (50%).

As shown in the above-mentioned two Examples, the conversion ratio of the transesterification reaction and the composition of the copolymer can be calculated by comparing the peak areas of the methyl group and α-position when γ-methyl-L-glutamic acid is contained, and comparing the peak areas of the benzyl group and α-position when γ-benzyl-L-glutamic acid is contained.

Evaluation Method 1: Evaluation (1) of Memory Property

The memory property was evaluated by measuring the electric current flown between the source and drain when a gate bias is applied from the ITO gate electrode of the element produced. First, the voltage Vds between the source and drain was fixed constant, and a gate voltage Vg was applied within the range of +20-+50 V at room temperature. Thereafter, Vg was swept from −50 to −20 V stepwisely, after which continuously swept from +20 to +50 V. One second after the voltage step, the electric current Ids flowing between the source and drain was measured. Thereafter, a measurement similar to that at room temperature was conducted at 50° C. or 85° C., 100° C. and 150° C. The ON/OFF ratio of Ids was calculated wherein the maximum value of Ids was ON value, and the minimum value was OFF value. The memory property was evaluated by the following criteria.

⊙: ON/OFF ratio of Ids was not less than $1.0 \times 10^5$.
○: ON/OFF ratio of Ids was not less than $5.0 \times 10^2$ and less than $1.0 \times 10^5$.
Δ: ON/OFF ratio of Ids was not less than $1.0 \times 10^2$ and less than $5.0 \times 10^2$.
x: ON/OFF ratio of Ids was less than $1.0 \times 10^2$.

Evaluation Method 2: Film Forming Property

The film thickness of the produced element was measured, and the standard deviation value of the film thickness was calculated.

The evaluation criteria were as follows.
⊙: Standard deviation was less than 30 nm.
○: Standard deviation was not less than 30 nm and less than 60 nm.
Δ: Standard deviation was not less than 60 nm and less than 100 nm.
x: Standard deviation was not less than 100 nm.

TABLE 4

| | polymer (composition: mol %) | memory property measurement condition | | memory property (1) | | | | | film forming property |
|---|---|---|---|---|---|---|---|---|---|
| | | | Vds | Vg | 23° C. | 50° C. | 85° C. | 100° C. | 150° C. | |
| Ex. 1 | γ-methyl-L-glutamic acid (37%)/γ-hexyl-L-glutamic acid (63%) copolymer | Syn. Ex. 1 | −50 | −50-+50 | ○ | — | ⊙ | ⊙ | ○ | ○ |
| Ex. 2 | γ-methyl-L-glutamic acid (18%)/γ-hexyl-L-glutamic acid (82%) copolymer | Syn. Ex. 2 | −50 | −50-+50 | ○ | — | ⊙ | ⊙ | ⊙ | ○ |
| Ex. 3 | γ-methyl-L-glutamic acid (50%)/γ-dodecyl-L-glutamic acid (50%) copolymer | Syn. Ex. 8 | −50 | −50-+50 | ○ | — | ○ | ○ | ○ | ⊙ |
| Ex. 4 | γ-benzyl-L-glutamic acid (60%)/γ-dodecyl-L-glutamic acid (40%) copolymer | Syn. Ex. 9 | −50 | −50-+50 | ○ | — | ○ | ○ | ○ | ○ |
| Ex. 5 | γ-methyl-L-glutamic acid (67%)/γ-2,2,2-trifluoroethyl-L-glutamic acid (33%) copolymer | Syn. Ex. 5 | −50 | −50-+50 | ○ | — | Δ | ○ | ○ | ○ |
| Ex. 6 | γ-methyl-L-glutamic acid (<1%)/γ-(6-(p-pentylcarbonylphenoxy)-1-hexyl)-L-glutamic acid (>99%) copolymer | Syn. Ex. 20 | −50 | −20-+20 | ○ | ○ | — | ○ | ○ | ○ |
| Ex. 7 | γ-methyl-L-glutamic acid (47%)/N$^ε$-benzyloxycarbonyl-L-lysine (53%) copolymer | Syn. Ex. 26 | −50 | −50-+50 | ○ | — | ○ | ○ | ⊙ | ○ |

TABLE 4-continued

| | polymer (composition: mol %) | | memory property measurement condition | | memory property (1) | | | | | film forming property |
|---|---|---|---|---|---|---|---|---|---|---|
| | | | Vds | Vg | 23° C. | 50° C. | 85° C. | 100° C. | 150° C. | |
| Ex. 8 | γ-benzyl-L-glutamic acid (49%)/N$^\varepsilon$-benzyloxycarbonyl-L-lysine (51%) copolymer | Syn. Ex. 27 | −50 | −50−+50 | ⊙ | — | ⊙ | ○ | ○ | ○ |
| Com. Ex. 1 | poly-γ-methyl-L-glutamic acid | | −20 | −20−+20 | ○ | ○ | Δ | X | X | ○ |
| Com. Ex. 2 | poly-γ-benzyl-L-glutamic acid | | −100 | −100−+100 | X | — | — | — | — | — |
| Com. Ex. 3 | poly-L-arginine | | −10 | −20−+20 | X | — | — | — | — | — |

TABLE 5

| Ex. | polymer (composition: mol %) | | memory property measurement condition | | memory property (1) | film forming property |
|---|---|---|---|---|---|---|
| | | | Vds | Vg | 23° C. | |
| Ex. 9 | γ-methyl-L-glutamic acid (<1%)/γ-(6-(p-methoxyphenoxy)-1-hexyl)-L-glutamic acid (>99%) copolymer | Syn. Ex. 10 | −50 | −20−+20 | ○ | ○ |
| Ex. 10 | γ-methyl-L-glutamic acid (47%)/γ-octyl-L-glutamic acid (53%) copolymer | Syn. Ex. 6 | −10 | −50−+50 | ○ | ○ |
| Ex. 11 | γ-methyl-L-glutamic acid (59%)/γ-2-ethoxyethyl-L-glutamic acid (41%) copolymer | Syn. Ex. 13 | −50 | −50−+50 | ○ | ○ |
| Ex. 12 | γ-methyl-L-glutamic acid (49%)/γ-6-chlorohexyl-L-glutamic acid (51%) copolymer | Syn. Ex. 14 | −50 | −50−+50 | ○ | ○ |
| Ex. 13 | γ-methyl-L-glutamic acid (68%)-N$^\varepsilon$-benzyloxycarbonyl-L-lysine (32%) block copolymer | Syn. Ex. 31 | −10 | −50−+50 | ⊙ | ○ |
| Ex. 14 | γ-methyl-L-glutamic acid (41%)-N$^\varepsilon$-benzyloxycarbonyl-L-lysine (18%)-γ-methyl-L-glutamic acid (41%) block copolymer | Syn. Ex. 32 | −10 | −50−+50 | ○ | ○ |

Figure 2:
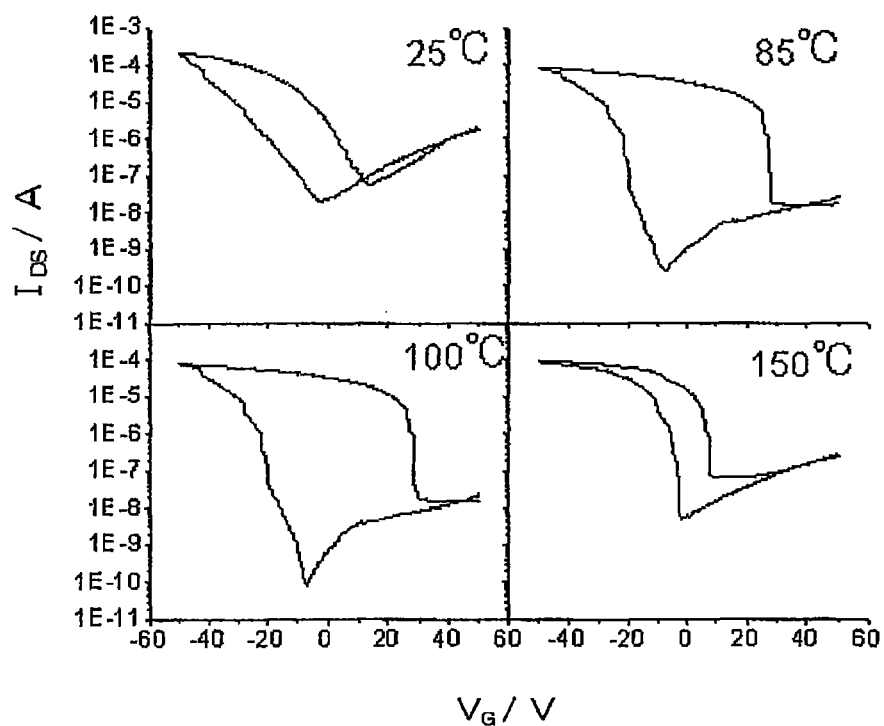
FIG. 2 shows an electric current-voltage property (transfer characteristic) of the ferroelectric memory element of Example 1 at an applied voltage—50 V.
Figure 3:
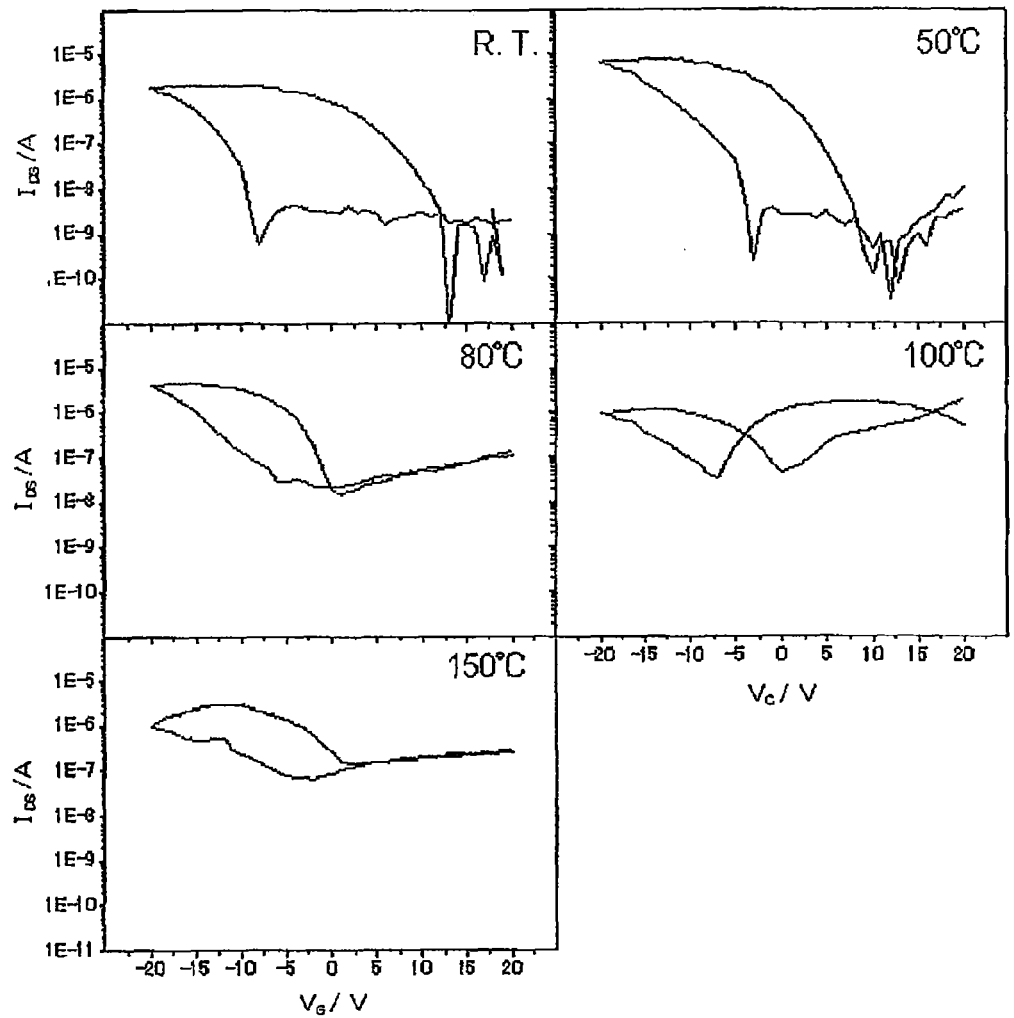
FIG. 3 shows an electric current-voltage property (transfer characteristic) of the ferroelectric memory element of Comparative Example 1 at an applied voltage—20 V.

The particular poly α-amino acid of the present invention was found to be able to form a thin film having high uniformity of the film thickness. When the thin film of Comparative Example 1 made from poly-γ-methyl-L-glutamic acid (PMLG) described in patent document 2 was used, the ON/OFF ratio markedly decreased as the temperature rose. However, in the field-effect transistor using a thin film of the particular poly α-amino acid of the present invention, the ON/OFF ratio did not decrease even when exposed to a high temperature (FIG. 2 shows the electric current-voltage characteristic (transfer characteristic) of the polymer of Synthetic Example 1, and FIG. 3 shows the electric current-voltage characteristic (transfer characteristic) of the polymer of Comparative Example 1. In FIG. 2 and FIG. 3, the horizontal axis shows $V_G/V$, and the vertical axis shows $I_{DS}/A$.) In FIGS. 2 and 3, the indication of "E-X" shows "$10^{-X}$". Particularly, the γ-methyl-L-glutamic acid/γ-hexyl-L-glutamic acid copolymer (Examples 1 and 2) showed preferable results in all of the film forming property and memory property.

Comparative Example 2 is an evaluation of a thin film of poly-γ-benzyl-L-glutamic acid (PBLG) described in patent document 2, and patent document 2 describes that the externally applied voltage required for polarization variation, namely, a driving voltage for an information recording element, becomes high due to an electrostatic interaction of aromatic substituents. To solve this problem, PBLG and PMMA are blended in patent document 3 to weaken the effect of inhibitory electrostatic interactions. However, it was found in an experiment conducted by the present inventors that a thin film with a uniform composition cannot be formed from a blend, since phase separation occurs. Comparative Example 3 is an evaluation of a thin film of poly-L-arginine described in patent document 2, and the ON/OFF ratio is small. Since poly-L-arginine shows low solubility in organic solvents, provision of ink is difficult.

Evaluation Method 3: Evaluation of Solubility in Solvents

Synthesized compounds were added to various solvents, and the mixture was stirred at room temperature, and the solubility was evaluated.

The evaluation criteria were as follows.

○: completely dissolved
Δ: partly soluble
x: insoluble

TABLE 6

| | | dichloro-methane | cyclo-hexanone | N,N-dimethyl-acetamide | methyl benzoate | toluene |
|---|---|---|---|---|---|---|
| Syn. Ex. 1 | γ-methyl-L-glutamic acid/γ-hexyl-L-glutamic acid copolymer | ○ | ○ | ○ | ○ | ○ |
| Syn. Ex. 9 | γ-benzyl-L-glutamic acid/γ-dodecyl-L-glutamic acid copolymer | ○ | ○ | ○ | ○ | ○ |
| Syn. Ex. 31 | γ-methyl-L-glutamic acid-N$^ε$-benzyloxycarbonyl-L-lysine-γ-methyl-L-glutamic acid block copolymer | ○ | ○ | ○ | ○ | Δ |
| Syn. Ex. 32 | γ-methyl-L-glutamic acid-N$^ε$-benzyloxycarbonyl-L-lysine-γ-methyl-L-glutamic acid block copolymer | ○ | Δ | ○ | ○ | Δ |
| | poly-γ-methyl-L-glutamic acid | ○ | X | X | X | X |
| | P (VDF/TrFE) | Δ | Δ | ○ | X | X |

The solvents used for the experiment were as follows.
dichloromethane: manufactured by JUNSEI CHEMICAL CO., LTD., special grade
cyclohexanone: manufactured by Tokyo Chemical Industry Co., Ltd.
N,N-dimethylacetamide: manufactured by KANTO CHEMICAL Co., Ltd., Cica special grade
methyl benzoate: manufactured by KANTO CHEMICAL Co., Ltd., Cica special grade
toluene: manufactured by JUNSEI CHEMICAL CO., LTD., special grade It was clarified that the polyamino acid of the present invention can be used as a material to be printed on, which is required to be dissolved in various solvents.

The polyamino acids of Synthetic Examples 1 and 9 were completely dissolved in the following solvents.
triethylene glycol dimethylether: manufactured by Nacalai Tesque
methyl ethyl ketone: manufactured by KANTO CHEMICAL Co., Ltd., Cica special grade
acetone: manufactured by JUNSEI CHEMICAL CO., LTD., special grade
butyl carbitol acetate: manufactured by KANTO CHEMICAL Co., Ltd., Cica special grade Evaluation Method 4: Evaluation (2) of Memory Property A polymer prepared by a transesterification method (poly-γ-methyl-L-glutamic acid is polymerized, and a transesterification reaction is performed using octanol and acid catalyst (p-toluenesulfonic acid)) (Synthetic Example 6), and a polymer prepared by a direct polymerization method (monomers of γ-methyl-L-glutamic acid and γ-octyl-L-glutamic acid are respectively prepared, and the monomers are polymerized) (Synthetic Example 25) were dissolved in 1,2-dichloroethane at 7 wt % to give polyamino acid-containing ink. Using the ink, 4 elements were prepared at once, and evaluated for stable expression of memory property.

TABLE 7

| Ex. | polymer (composition: mol %) | | polymerization conditions | p-toluenesulfonic acid concentration (wt %) | memory property measurement condition | | memory property (2) |
|---|---|---|---|---|---|---|---|
| | | | | | Vds | Vg | |
| Ex. 15 | γ-methyl-L-glutamic acid unit (40%)/γ-octyl-L-glutamic acid (60%) copolymer | Syn. Ex. 25 | direct polymerization method | 0 | −10 | −50-+50 | all 4 elements expressed memory property |
| Ex. 16 | γ-methyl-L-glutamic acid unit (47%)/γ-octyl-L-glutamic acid (53%) copolymer | Syn. Ex. 6 | transesterification method | 0.41 | −10 | −50-+50 | one of 4 elements expressed memory property |

It was clarified that the element of Example 15, which was produced using a polymer prepared by the direct polymerization method, more stably expressed the memory property than the element of Example 16, which was produced using a polymer prepared by the transesterification method.

(Provision of Ink and Memory Element Array)

Figure 6:
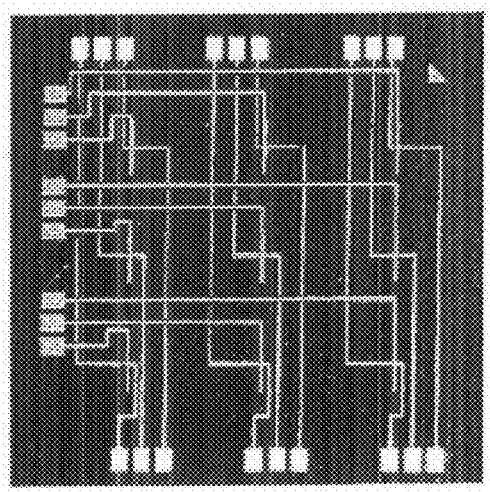
FIG. 6 is a flat plane view of the ferroelectric memory element of the present invention (memory array).

A γ-methyl-L-glutamic acid/γ-hexyl-L-glutamic acid copolymer was dissolved in N-methylpyrrolidone (manufactured by KANTO CHEMICAL Co., Ltd., Cica special grade) and adjusted to a concentration of 50 wt %. The Thixotropy index (TI) value calculated by a rotational viscometer (Rheologia A300, manufactured by Elquest Corporation) was 1.48, which confirms the presence of ink property applicable to screen printing. Using the prepared solution as ink, patterning was performed by screen printing. As a result, a pattern could be printed with the definition of line width 100 μm, line length 3 mm. Using the ink, a memory array can be provided. For example, the memory array shown in FIG. 6 can be produced by sequentially layering silver ink (RAFS059, manufactured by TOYO INK Co., Ltd.) as a gate electrode and source and drain electrodes, and a solution (50 wt %) of a γ-methyl-L-glutamic acid/γ-hexyl-L-glutamic acid copolymer in N-methylpyrrolidone as a ferroelectric layer by screen printing.

(Production of Resonance Tag Incorporating Transistor)

Figure 7:
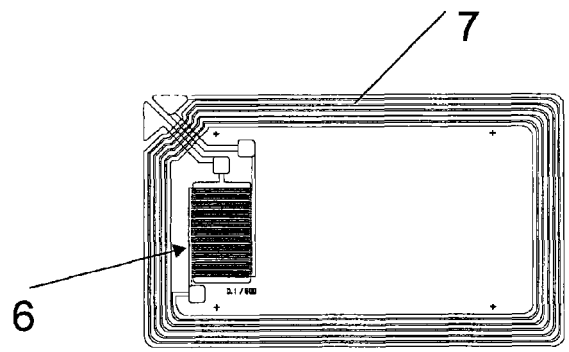
FIG. 7 is a flat plane view of other tag using the ferroelectric memory element of the present invention.
Figure 8:
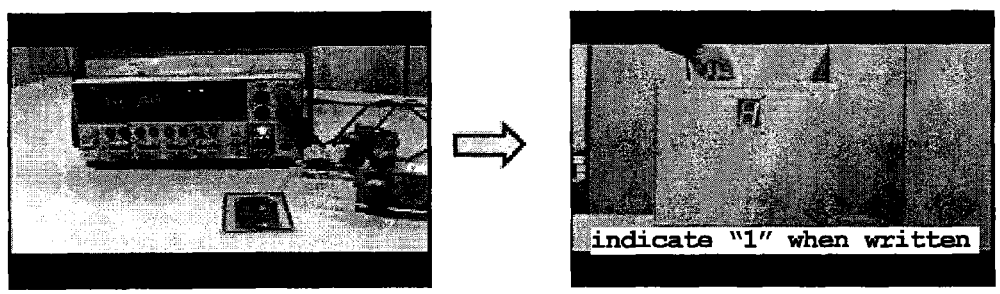
FIG. 8 is a photograph explaining an operation confirming test of the tag of the present invention.
Figure 8:
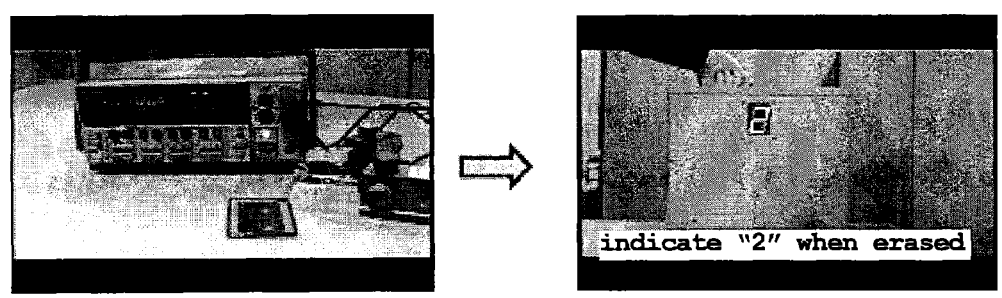

An antenna 7 was produced using a silver ink on a poly(ethylene terephthalate) substrate, and a transistor type ferroelectric memory element 6 produced separately was connected in series to give the tag shown in FIG. 7. As shown in FIG. 8, −50 V voltage was applied (written) to a gate voltage of the produced tag, and the tag was held over the reading element. As a result, it was confirmed that resonance occurred at a frequency corresponding to "1". Then, +50 V voltage was applied to a gate voltage (erased), and the tag was held over the reading element. As a result, it was confirmed that resonance occurred at a frequency corresponding to "2".

INDUSTRIAL APPLICABILITY

The poly α-amino acid of the present invention shows ferroelectricity even under a high temperature environment, and has good film forming property. Therefore, using a thin film of poly α-amino acid of the present invention, a ferroelectric memory element showing superior operational stability even when exposed to a high temperature can be provided. The ferroelectric memory element can be produced easily, can afford a film element, can provide a large area, can be a flexible element, is suitable for large-scale production and has high industrial utility value, since a ferroelectric thin film can be easily formed by application or printing.

The ferroelectric memory element can be utilized as a recording element such as RFID and the like. For example, it can be used by applying to paper money, coins, packaging containers, product packages, containers, tags for specifying goods, tags, slips, books, vehicles, foods, clothing, daily commodities, medications and electronic instruments for specifying traceability in distribution, tags for product line management system and the like.

This application is based on a patent application No. 2011-107643 filed in Japan, the contents of which are incorporated in full herein.

EXPLANATION OF SYMBOLS 1 substrate
2 gate electrode
3 ferroelectric layer
4 semiconductor layer
5 drain electrode and source electrode
6 transistor type ferroelectric memory element
7 antenna
31, 32 substrate
41, 46 received data encoding circuit
42, 47 transmission data decoding circuit
43, 50 antenna element
44, 48 control circuit
45, 49 ferroelectric memory element
51 monocrystal silicon substrate

The invention claimed is:

1. A ferroelectric memory element, comprising a ferroelectric layer, wherein said ferroelectric layer comprises a poly α-amino acid which is a copolymer comprising:

(i) a glutamic acid-γ-ester unit represented by formula (I):

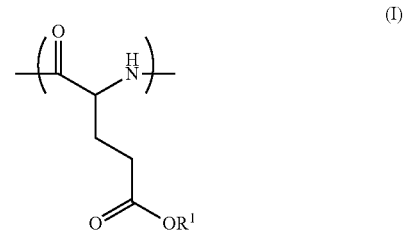

wherein $R^1$ is a substituted or unsubstituted alkyl group having 1 to 8 carbon atoms, or a benzyl group optionally substituted by a halogen atom, an alkoxy group or a nitro group; and either (iia) a glutamic acid-γ-ester unit represented by formula (II):

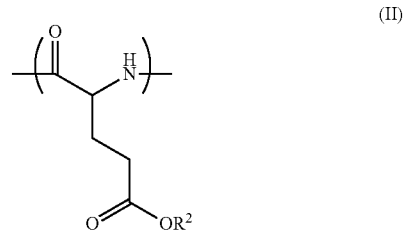

wherein $R^2$ is an unsubstituted alkyl group having 3 to 16 carbon atoms, or an alkyl group having 1 to 6 carbon wherein a part or all of the hydrogen atoms are substituted by a halogen atom, an alicyclic hydrocarbon group having 3 to 12 carbon atoms, an alkoxy group having 1 to 6 carbon atoms, a cyano group, a phenyl group in which a part or all of the hydrogen atoms are optionally substituted by a halogen atom or an alkoxy group, a phenyl alkoxy group in which a part or all of the hydrogen atoms are optionally substituted by a halogen atom or an alkoxy group, or a phenylalkyl carbamate group in which a part or all of the hydrogen atoms are optionally substituted by a halogen atom or an alkoxy group, provided that $R^2$ is not the same as $R^1$; or (iib) an alanine, phenylalanine or N-substituted lysine unit represented by formula (III):

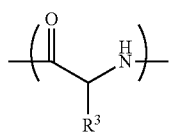
(III)

wherein R³ is a methyl group, a benzyl group or a —(CH₂)₄—NHX group (wherein X is a benzyloxycarbonyl group optionally substituted by a halogen atom or an alkoxy group, an alkylcarbonyl group optionally substituted by a halogen atom, an allyloxycarbonyl group, a fluorenylalkoxycarbonyl group, a benzenesulfonyl group optionally substituted by an alkyl group or a nitro group, or an alkyloxycarbonyl group), wherein the molar ratio of units of formula (I) to units of formula (II) or units of formula (III), (I)/(II) or (I)/(III), is 10/90 to 90/10.

2. A ferroelectric memory element according to claim 1, wherein:
in formula (I), R¹ is a methyl group or a benzyl group;
in formula (II), R² is an unsubstituted alkyl group having 6 to 16 carbon atoms or an alkyl group having 1 to 6 carbon atoms wherein part or all of the hydrogen atoms are substituted by a halogen atom or an alicyclic hydrocarbon group having 3 to 12 carbon atoms; and
in formula (III), R³ is a methyl group, a benzyl group or a —(CH₂)₄—NHX group, wherein X is a benzyloxycarbonyl group.

3. A ferroelectric memory element according to claim 1, wherein said poly α-amino acid is a copolymer comprising units of formula (I) and units of formula (II).

4. A ferroelectric memory element according to claim 3, wherein said poly α-amino acid is obtained by polymerizing an N-carboxy-α-glutamic acid-γ-ester anhydride comprising an ester group represented by the formula: —COOR¹ wherein R¹ is as defined above introduced therein and an N-carboxy-α-glutamic acid-γ-ester anhydride comprising an ester group represented by the formula: —COOR² wherein R² is as defined above introduced therein.

5. A ferroelectric memory element, comprising a ferroelectric layer, wherein said ferroelectric layer comprises:
(i) a poly α-amino acid which is a homopolymer of a glutamic acid-γ-ester unit represented by formula (IV):

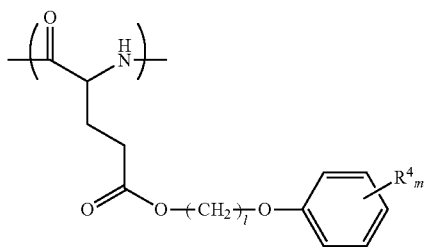
(IV)

wherein each R⁴ is independently an alkoxy group having 1 to 12 carbon atoms, an alkyl group having 1 to 12 carbon atoms wherein part or all of the hydrogen atoms are substituted by a halogen atom, or an alkylcarbonyl group wherein the alkyl group has 1 to 12 carbon atoms, l is an integer of 6 to 12, and m is an integer of 1 to 3; or (ii) a copolymer of a glutamic acid-γ-ester unit represented by formula (IV) and a glutamic acid-γ-ester unit represented by formula (I):

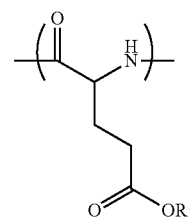
(I)

wherein R¹ is a substituted or unsubstituted alkyl group having 1 to 8 carbon atoms, or a benzyl group optionally substituted by a halogen atom, an alkoxy group or a nitro group,
wherein the content of said glutamic acid-γ-ester unit represented by formula (IV) is not less than 40 mol % based on the total moles in said copolymer.

6. A ferroelectric memory element according to claim 5, wherein said poly α-amino acid is a copolymer comprising units of formula (I) and units of formula (IV), R¹ in formula (I) is a methyl group or a benzyl group, and the content of said glutamic acid-γ-ester unit represented by formula (IV) in the copolymer is not less than 80 mol % based on the total moles in said copolymer.

7. A ferroelectric memory element according to claim 5, wherein said poly α-amino acid is obtained by:
(a) polymerizing an N-carboxy-α-glutamic acid-γ-ester anhydride comprising an ester group represented by formula: —COOR⁵ wherein R⁵ is

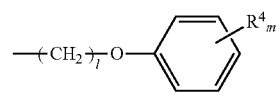

wherein R⁴, l and m are as defined above, introduced therein; or
(b) polymerizing said N-carboxy-α-glutamic acid-γ-ester anhydride and an N-carboxy-α-glutamic acid-γ-ester anhydride comprising an ester group represented by formula: —COOR¹ wherein R¹ is as defined above introduced therein.

8. A ferroelectric memory element according to claim 1, wherein said poly α-amino acid has a number average molecular weight of 2,000 to 50,000.

9. A ferroelectric memory element according to claim 1, which exhibits a memory property at 100° C.

10. A ferroelectric memory element according to claim 1, which is a transistor type.

11. A ferroelectric memory element according to claim 10, comprising a ferroelectric layer, a gate electrode, a semiconductor layer, a source electrode, and a drain electrode on a substrate.

12. Ae ferroelectric memory element according to claim 11, wherein said source electrode and said drain electrode are configured on said semiconductor layer.

13. A tag, comprising a ferroelectric memory element according to claim 1.

14. A method of producing a ferroelectric memory element, comprising:

(a) dissolving one or more kinds of poly α-amino acids selected from the group consisting of (A-1) a poly α-amino acid which is a copolymer comprising a glutamic acid-γ-ester unit represented by formula (I):

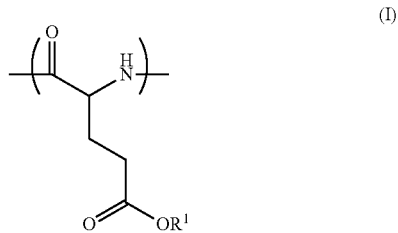

wherein R¹ is a substituted or unsubstituted alkyl group having 1 to 8 carbon atoms, or a benzyl group optionally substituted by a halogen atom, an alkoxy group or a nitro group; and a glutamic acid-γ-ester unit represented by formula (II):

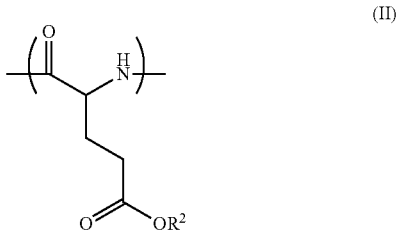

wherein R² is an unsubstituted alkyl group having 3 to 16 carbon atoms, or an alkyl group having 1 to 6 carbon wherein part or all of the hydrogen atoms are substituted by a halogen atom, an alicyclic hydrocarbon group having 3 to 12 carbon atoms, an alkoxy group having 1 to 6 carbon atoms, a cyano group, a phenyl group (wherein a part or all of the hydrogen atoms are optionally substituted by a halogen atom or an alkoxy group), a phenylalkoxy group (wherein a part or all of the hydrogen atoms are optionally substituted by a halogen atom or an alkoxy group), or a phenylalkylcarbamate group (wherein a part or all of the hydrogen atoms are optionally substituted by a halogen atom or an alkoxy group), provided that R² is not the same as R¹; or an alanine, phenylalanine or N-substituted lysine unit represented by formula (III):

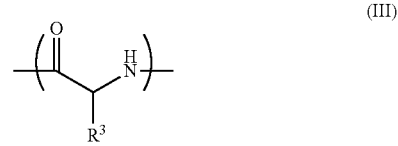

wherein R³ is a methyl group, a benzyl group or a —(CH₂)₄—NHX group (wherein X is a benzyloxycarbonyl group optionally substituted by a halogen atom or an alkoxy group, an alkylcarbonyl group optionally substituted by a halogen atom, an allyloxycarbonyl group, a fluorenylalkoxycarbonyl group, a benzenesulfonyl group optionally substituted by an alkyl group or a nitro group, or an alkyloxycarbonyl group), wherein the molar ratio of units of formula (I) to units of formula (II) or units of formula (III), (I)/(II) or (I)/(III), is 10/90 to 90/10, and (A-2) a poly α-amino acid which is a homopolymer of a glutamic acid-γ-ester unit represented by formula (IV):

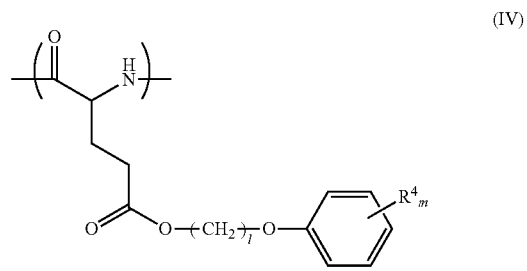

wherein each R⁴ is independently an alkoxy group having 1 to 12 carbon atoms, an alkyl group having 1 to 12 carbon atoms wherein a part or all of the hydrogen atoms are substituted by a halogen atom, or an alkylcarbonyl group wherein the alkyl group has 1 to 12 carbon atoms, l is an integer of 6 to 12, and m is an integer of 1 to 3; or a copolymer of a glutamic acid-γ-ester unit represented by the formula (IV) and a glutamic acid-γ-ester unit represented by formula (I):

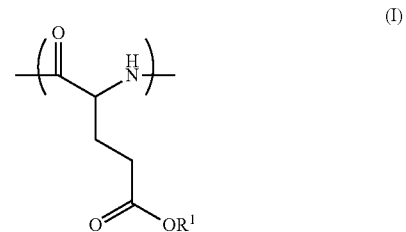

wherein R¹ is a substituted or unsubstituted alkyl group having 1 to 8 carbon atoms, or a benzyl group optionally substituted by a halogen atom, an alkoxy group or a nitro group, wherein the content of said glutamic acid-γ-ester units represented by formula (IV) is not less than 40 mol %, in an organic solvent to give a poly α-amino acid-containing ink;

(b) applying said poly α-amino acid-containing ink onto a substrate; and (c) drying said applied poly α-amino acid-containing ink.

15. A method according to claim 14, wherein said organic solvent is one or more kinds selected from the group consisting of a chlorohydrocarbon solvent, a fluorine-containing branched alcohol solvent, a nitrogen-containing polar solvent, a hydrocarbon ketone solvent, a benzoic acid ester solvent, an aromatic hydrocarbon solvent, a glycol ether solvent, and a glycol ester solvent.

16. A method according to claim 14, wherein said organic solvent is one or more kinds selected from the group consisting of dichloromethane, chloroform, 1,1,1,3,3,3-hexafluoroisopropanol, methylene chloride, dichloroethane, N-methylpyrrolidone, N,N-dimethylacetamide, methyl ethyl ketone, cyclohexanone, methyl benzoate, toluene, triethylene glycol dimethylether, acetone, and butyl carbitol acetate.

17. A method according to claim 14, wherein said applying said poly α-amino acid-containing ink onto said substrate is carried out by printing said poly α-amino acid-containing ink on said substrate.

18. A poly α-amino acid which is a copolymer comprising:
(i) a glutamic acid-γ-ester unit represented by formula (I):

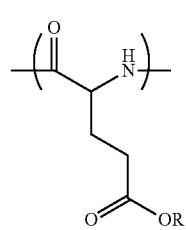

wherein R¹ is a substituted or unsubstituted alkyl group having 1 to 8 carbon atoms, or a benzyl group optionally substituted by a halogen atom, an alkoxy group or a nitro group; and either
(iia) a glutamic acid-γ-ester unit represented by formula (II):

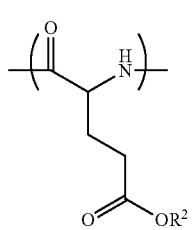

wherein R² is an alkyl group having 1 to 6 carbon wherein a part or all of the hydrogen atoms are substituted by a halogen atom, an alicyclic hydrocarbon group having 3 to 12 carbon atoms, an alkoxy group having 1 to 6 carbon atoms, a cyano group, a phenyl group (wherein a part or all of the hydrogen atoms are optionally substituted by a halogen atom or an alkoxy group), a phenylalkoxy group (wherein a part or all of the hydrogen atoms are optionally substituted by a halogen atom or an alkoxy group), or a phenylalkylcarbamate group (wherein a part or all of the hydrogen atoms are optionally substituted by a halogen atom or an alkoxy group), provided that R² is not the same as R¹; or
(iib) an alanine, phenylalanine or N-substituted lysine unit represented by formula (III):

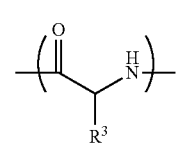

wherein R³ is a methyl group, a benzyl group or —(CH₂)₄—NHX group (wherein X is a benzyloxycarbonyl group optionally substituted by a halogen atom or an alkoxy group, an alkylcarbonyl group optionally substituted by a halogen atom, an allyloxycarbonyl group, a fluorenylalkoxycarbonyl group, a benzenesulfonyl group optionally substituted by an alkyl group or a nitro group, or an alkyloxycarbonyl group),
wherein the molar ratio of units of formula (I) to units of formula (II) or units of formula (III), (I)/(II) or (I)/(III), is 10/90-90/10.

19. A poly α-amino acid according to claim 18, wherein:
in formula (I), R¹ is a methyl group or a benzyl group;
in formula (II), R² is an alkyl group having 1 to 6 carbon atoms wherein a part or all of the hydrogen atoms are substituted by a halogen atom or an alicyclic hydrocarbon group having 3 to 12 carbon atoms; and
in formula (III), R³ is a methyl group, a benzyl group or a —(CH₂)₄—NHX group (wherein X is a benzyloxycarbonyl group).

20. A poly α-amino acid, which is a copolymer of a glutamic acid-γ-ester unit represented by formula (IV):

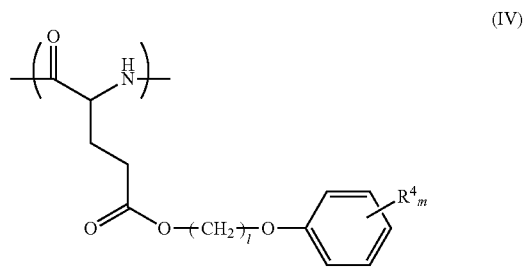

wherein each R⁴ is independently an alkyl group having 1 to 12 carbon atoms wherein a part or all of the hydrogen atoms are substituted by a halogen atom, l is an integer of 6 to 12, and m is an integer of 1 to 3, and a glutamic acid-γ-ester unit represented by formula (I):

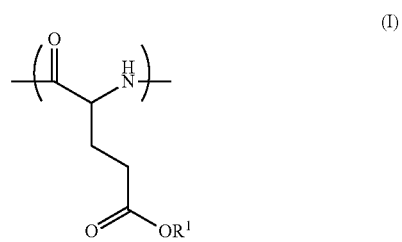

wherein R¹ is a substituted or unsubstituted alkyl group having 1 to 8 carbon atoms, or a benzyl group optionally substituted by a halogen atom, an alkoxy group or a nitro group,
wherein the content of said glutamic acid-γ-ester unit represented by formula (IV) is not less than 40 mol %, based on the total moles in said copolymer.

21. A poly α-amino acid according to claim 20, which is a copolymer comprising units of formula (I) and unit of formula (IV), in the formula (I), R¹ is a methyl group or a benzyl group, and the content of said glutamic acid-γ-ester units represented by formula (IV) in the copolymer is not less than 80 mol %, based on the total moles in said copolymer.

22. A poly α-amino acid according to claim 18, which exhibits a memory property at 100° C.

23. A poly α-amino acid-containing ink, comprising one or more kinds of poly α-amino acids selected from the group consisting of:
(A-1) a poly α-amino acid which is a copolymer comprising:
(i) a glutamic acid-γ-ester unit represented by formula (I):

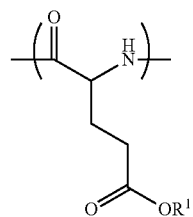

(I)

wherein $R^1$ is a substituted or unsubstituted alkyl group having 1 to 8 carbon atoms, or a benzyl group optionally substituted by a halogen atom, an alkoxy group or a nitro group, and either
(iia) a glutamic acid-γ-ester unit represented by formula (II):

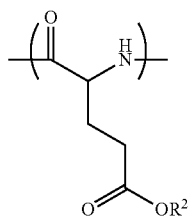

(II)

wherein $R^2$ is an unsubstituted alkyl group having 3 to 16 carbon atoms, or an alkyl group having 1 to 6 carbon wherein a part or all of the hydrogen atoms are substituted by a halogen atom, an alicyclic hydrocarbon group having 3 to 12 carbon atoms, an alkoxy group having 1 to 6 carbon atoms, a cyano group, a phenyl group (wherein a part or all of the hydrogen atoms are optionally substituted by a halogen atom or an alkoxy group), a phenylalkoxy group (wherein a part or all of the hydrogen atoms are optionally substituted by a halogen atom or an alkoxy group), or a phenylalkylcarbamate group (wherein a part or all of the hydrogen atoms are optionally substituted by a halogen atom or an alkoxy group), provided that $R^2$ is not the same as $R^1$; or
(iib) an alanine, phenylalanine or N-substituted lysine unit represented by formula (III):

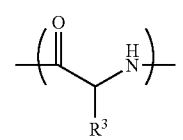

(III)

wherein $R^3$ is a methyl group, a benzyl group or —(CH$_2$)$_4$—NHX group (wherein X is a benzyloxycarbonyl group optionally substituted by a halogen atom or an alkoxy group, an alkylcarbonyl group optionally substituted by a halogen atom, an allyloxycarbonyl group, a fluorenylalkoxycarbonyl group, a benzenesulfonyl group optionally substituted by an alkyl group or a nitro group, or an alkyloxycarbonyl group),
wherein the molar ratio of units of formula (I) to units of formula (II) or units of formula (III), (I)/(II) or (I)/(III), is 10/90-90/10; and
(A-2) a poly α-amino acid which is a homopolymer of a glutamic acid-γ-ester unit represented by formula (IV):

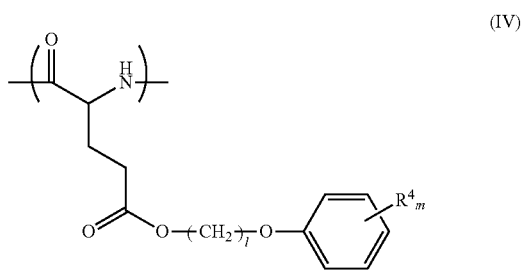

(IV)

wherein each $R^4$ is independently an alkoxy group having 1 to 12 carbon atoms, an alkyl group having 1 to 12 carbon atoms wherein a part or all of the hydrogen atoms are substituted by a halogen atom, or an alkylcarbonyl group wherein the alkyl group has 1 to 12 carbon atoms, l is an integer of 6 to 12, and m is an integer of 1 to 3, or
a copolymer of a glutamic acid-γ-ester unit represented by formula (IV) and a glutamic acid-γ-ester unit represented by formula (I):

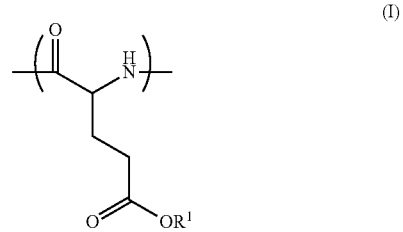

(I)

wherein $R^1$ is a substituted or unsubstituted alkyl group having 1 to 8 carbon atoms, or a benzyl group optionally substituted by a halogen atom, an alkoxy group or a nitro group,
wherein the content of said glutamic acid-γ-ester units represented by formula (IV) is not less than 40 mol %, based on the total moles in said copolymer; and
(B) an organic solvent.

24. A poly α-amino acid-containing ink according to claim 23, wherein said organic solvent is one or more kinds selected from the group consisting of a chlorohydrocarbon solvent, a fluorine-containing branched alcohol solvent, a nitrogen-containing polar solvent, a hydrocarbon ketone solvent, a benzoic acid ester solvent, an aromatic hydrocarbon solvent, a glycol ether solvent, and a glycol ester solvent.

25. A poly α-amino acid-containing ink according to claim 23, wherein said organic solvent is one or more kinds selected from the group consisting of dichloromethane, chloroform, 1,1,1,3,3,3-hexafluoroisopropanol, methylene chloride, dichloroethane, N-methylpyrrolidone, N,N-dimethylacetamide, methyl ethyl ketone, cyclohexanone, methyl benzoate, toluene, triethylene glycol dimethylether, acetone, and butyl carbitol acetate.

26. A poly α-amino acid-containing ink according to claim 23, wherein said poly α-amino acid is a copolymer comprising units of formula (I) and units of formula (II).

27. A poly α-amino acid-containing ink according to claim 26, wherein said poly α-amino acid is obtained by polymerizing a N-carboxy-α-glutamic acid-γ-ester anhydride comprising an ester group represented by formula: —COOR$^1$ wherein R$^1$ is as defined above introduced therein, and an N-carboxy-α-glutamic acid-γ-ester anhydride comprising an ester group represented by the formula: —COOR$^2$ wherein R$^2$ is as defined above introduced therein.

28. A poly α-amino acid-containing ink according to claim 23, wherein said poly α-amino acid is a homopolymer of units of formula (IV) or a copolymer comprising units of formula (IV) and units of formula (I).

29. A poly α-amino acid-containing ink according to claim 28, wherein said poly α-amino acid is obtained by:

polymerizing an N-carboxy-α-glutamic acid-γ-ester anhydride comprising an ester group represented by the formula: —COOR$^5$ wherein R$^5$ is

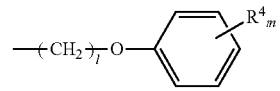

wherein R$^4$, l and m are as defined above, introduced therein; or polymerizing a N-carboxy-α-glutamic acid-γ-ester anhydride and an N-carboxy-α-glutamic acid-γ-ester anhydride comprising an ester group represented by the formula: —COOR$^1$ wherein R$^1$ is as defined above introduced therein.

30. A poly α-amino acid-containing ink according to claim 23, wherein said poly α-amino acid has a number average molecular weight of 2,000 to 50,000.

31. A poly α-amino acid-containing ink according to claim 23, which comprises said poly α-amino acid in an amount of 1 to 20 wt % based on the total weight of said ink.

32. A poly α-amino acid-containing ink according to claim 23, which is free of p-toluenesulfonic acid or wherein concentration of p-toluenesulfonic acid is not more than 0.5 wt % based on the total weight of said ink.

* * * * *